US012813334B2

(12) United States Patent
Um et al.

(10) Patent No.: US 12,813,334 B2
(45) Date of Patent: Nov. 24, 2026

(54) SEMICONDUCTOR PACKAGE AND METHOD OF FABRICATING THE SAME

(71) Applicant: Samsung Electronics Co., Ltd., Suwon-si (KR)

(72) Inventors: Changyong Um, Suwon-si (KR); Hyeran Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 684 days.

(21) Appl. No.: 18/066,558

(22) Filed: Dec. 15, 2022

(65) Prior Publication Data

US 2023/0395567 A1 Dec. 7, 2023

(30) Foreign Application Priority Data

Jun. 2, 2022 (KR) ........................ 10-2022-0067777

(51) Int. Cl.

| | |
|---|---|
| ***H01L 21/46*** | (2006.01) |
| ***H01L 23/52*** | (2006.01) |
| ***H10F 39/00*** | (2025.01) |
| ***H10W 90/00*** | (2026.01) |
| *H10W 90/20* | (2026.01) |

(52) U.S. Cl.

CPC .......... *H10W 90/00* (2026.01); *H10F 39/811* (2025.01); *H10W 90/291* (2026.01); *H10W 90/297* (2026.01)

(58) Field of Classification Search

CPC ........... H01L 21/7682; H01L 21/76898; H01L 2224/80895; H01L 2225/06541

See application file for complete search history.

(56) References Cited

U.S. PATENT DOCUMENTS

| | | | |
|---|---|---|---|
| 9,698,188 | B2 | 7/2017 | Togashi |
| 10,147,753 | B2 | 12/2018 | Yang et al. |
| 11,031,431 | B2 | 6/2021 | Fujii et al. |
| 11,244,925 | B2 | 2/2022 | Kao et al. |
| 11,271,027 | B2 | 3/2022 | Kawashima |

(Continued)

FOREIGN PATENT DOCUMENTS

| | | | |
|---|---|---|---|
| JP | 2008066409 | A | 3/2008 |
| JP | 5501860 | B2 | 3/2014 |
| WO | 2020262320 | A1 | 12/2020 |

*Primary Examiner* — Kretelia Graham
*Assistant Examiner* — David J Goodwin
(74) *Attorney, Agent, or Firm* — Wolf, Greenfield & Sacks, P.C.

(57) ABSTRACT

A semiconductor package includes first, second, and third semiconductor chips. The second semiconductor chip includes a semiconductor substrate, a first wiring layer on a first surface of the semiconductor substrate, a second wiring layer on a second surface of the semiconductor substrate, and a through via that penetrates the semiconductor substrate and electrically connects the first wiring layer and the second wiring layer. The semiconductor substrate and the through via are spaced apart from each other across a spacer structure. The spacer structure includes a first liner layer in contact with the semiconductor substrate, a second liner layer in contact with the through via, an air gap between the first liner layer and the second liner layer, and a capping layer that seals the air gap on the first liner layer and the second liner layer.

18 Claims, 40 Drawing Sheets

(56) References Cited

U.S. PATENT DOCUMENTS

| | | | | |
|---|---|---|---|---|
| 2012/0153500 | A1* | 6/2012 | Kim | H10W 20/023<br>438/653 |
| 2013/0115769 | A1* | 5/2013 | Yu | H10W 20/20<br>257/E21.597 |
| 2015/0243583 | A1* | 8/2015 | Li | H10W 20/20<br>257/774 |
| 2020/0357723 | A1* | 11/2020 | Shohji | H01L 21/76831 |
| 2022/0006968 | A1 | 1/2022 | Yamashita | |
| 2023/0049255 | A1* | 2/2023 | Yang | H10F 39/809 |

* cited by examiner

SEMICONDUCTOR PACKAGE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2022-0067777, filed on Jun. 2, 2022, in the Korean Intellectual Property Office, the disclosure of which is hereby incorporated by reference in its entirety.

BACKGROUND

The present inventive concepts relate to a semiconductor package and a method of fabricating the same, and more particularly, to a semiconductor package including an image sensor and a method of fabricating the same.

In general, an image sensor is a semiconductor device that converts optical images into electrical signals. The image sensor is broadly classified into a charge coupled device (CCD) type image sensor and a complementary metal oxide silicon (CMOS) type image sensor (also referred to as CIS).

Recent advances in computer and communication industries have led to strong demands in high performances image sensors in various consumer electronic devices such as digital cameras, camcorders, PCSs (Personal Communication Systems), game devices, security cameras, medical micro cameras, etc. A plurality of image sensors have recently been used in portable electronic devices, and thus the plurality of image sensors are integrated and utilized in the devices.

In the semiconductor industry, high capacity, thinness, and compactness of semiconductor devices and electronic products using the same have been demanded and thus various package techniques have been suggested.

SUMMARY

Some embodiments of the inventive concepts provide a semiconductor package with improved electrical properties and a method of fabricating the same.

Some embodiments of the inventive concepts provide a semiconductor package with improved structural stability and a method of fabricating the same.

According to some embodiments of the inventive concepts, a semiconductor package may include: a first semiconductor chip; a second semiconductor chip below the first semiconductor chip; and a third semiconductor chip below the second semiconductor chip. The second semiconductor chip may include: a semiconductor substrate; a first wiring layer on a first surface of the semiconductor substrate; a second wiring layer on a second surface of the semiconductor substrate; and a through via that penetrates the semiconductor substrate and electrically connects the first wiring layer and the second wiring layer. The semiconductor substrate and the through via may be spaced apart from each other across a spacer structure. The spacer structure may include: a first liner layer in contact with the semiconductor substrate; a second liner layer in contact with the through via; an air gap between the first liner layer and the second liner layer; and a capping layer that seals the air gap on the first liner layer and the second liner layer.

According to some embodiments of the inventive concepts, a semiconductor package may include: an image sensor chip including a first pad; a logic chip below the image sensor chip and including a second pad, wherein the first pad and the second pad are in direct contact with each other on an interface between the image sensor chip and the logic chip; and a memory chip below the logic chip. The logic chip may include: a semiconductor substrate; a conductive pattern on an active surface of the semiconductor substrate; a first dielectric layer that covers the conductive pattern on the active surface of the semiconductor substrate; a through hole that vertically penetrates the semiconductor substrate and at least a portion of the first dielectric layer and exposes the conductive pattern; a first liner layer that conformally covers an inner side surface and at least a portion of bottom surface of the through hole; a capping layer that covers at least a portion of the through hole and an inactive surface of the semiconductor substrate; a second dielectric layer that covers the capping layer on the inactive surface of the semiconductor substrate; and a through via in the through hole, the through hole penetrating at least a portion of the second dielectric layer and the first liner layer and connecting the first pad to the conductive pattern. In the through hole, an air gap may be defined by the through via, the first liner layer, and the capping layer.

According to some embodiments of the inventive concepts, a method of fabricating a semiconductor package may include: forming a logic chip; directly bonding an image sensor chip onto the logic chip, wherein a first pad of the logic chip is directly bonded to a second pad of the image sensor chip; and bonding a memory chip below the logic chip. The step of forming the logic chip may include: forming a conductive pattern on an active surface of a semiconductor substrate; forming a first dielectric layer on the active surface of the semiconductor substrate, the first dielectric layer covering the conductive pattern; forming a first through hole that penetrates the semiconductor substrate and the first dielectric layer and exposes the conductive pattern; forming a first liner layer that conformally covers an inactive surface of the semiconductor substrate, an inner lateral surface of the first through hole, and a bottom surface of the first through hole; forming a through via in the first through hole, the through via penetrating the first liner layer to come into connection with the conductive pattern, and the through via being spaced apart from the inner lateral surface of the first through hole; in the first through hole, allowing a decomposition layer to fill a space between the first liner layer and the through via; forming a capping layer on the inactive surface of the semiconductor substrate, the capping layer covering the decomposition layer and the through via; removing the decomposition layer to form an air gap; forming the first pad on the through via; and forming a second dielectric layer on the inactive surface of the semiconductor substrate, the second dielectric layer partially surrounding the through via.

BRIEF DESCRIPTION OF THE DRAWINGS

FIGS. 11A to 25A are cross-sectional views illustrating a method of fabricating a semiconductor package according to some embodiments of the inventive concepts.

FIGS. 11B to 25B are enlarged views illustrating section B of FIGS. 11A to 25A, respectively.

DETAILED DESCRIPTION

The following will now describe semiconductor packages and methods of fabricating the same according to the present inventive concepts with reference to the accompanying drawings.

Figure 1:
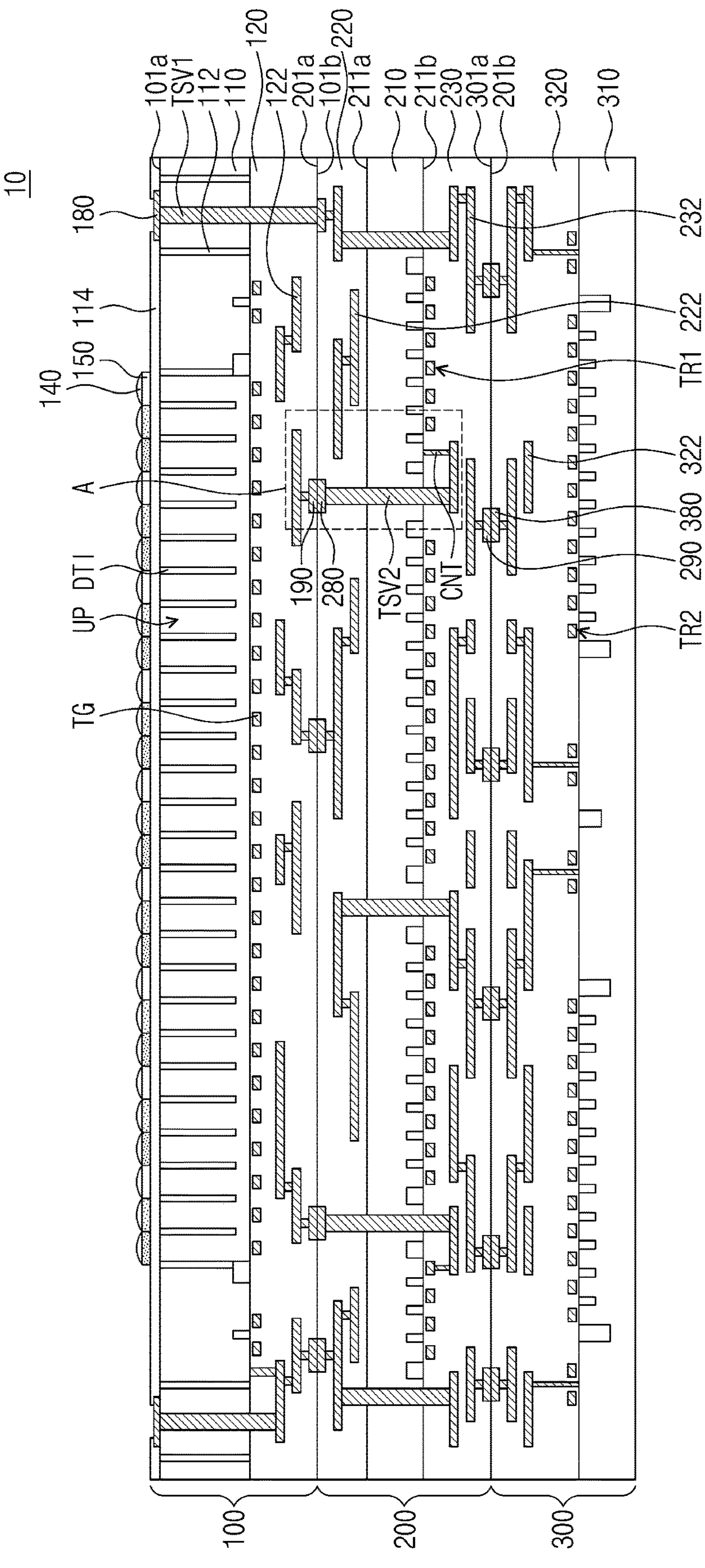
FIG. 1 is a cross-sectional view illustrating a semiconductor package according to some embodiments of the inventive concepts.
Figure 2:
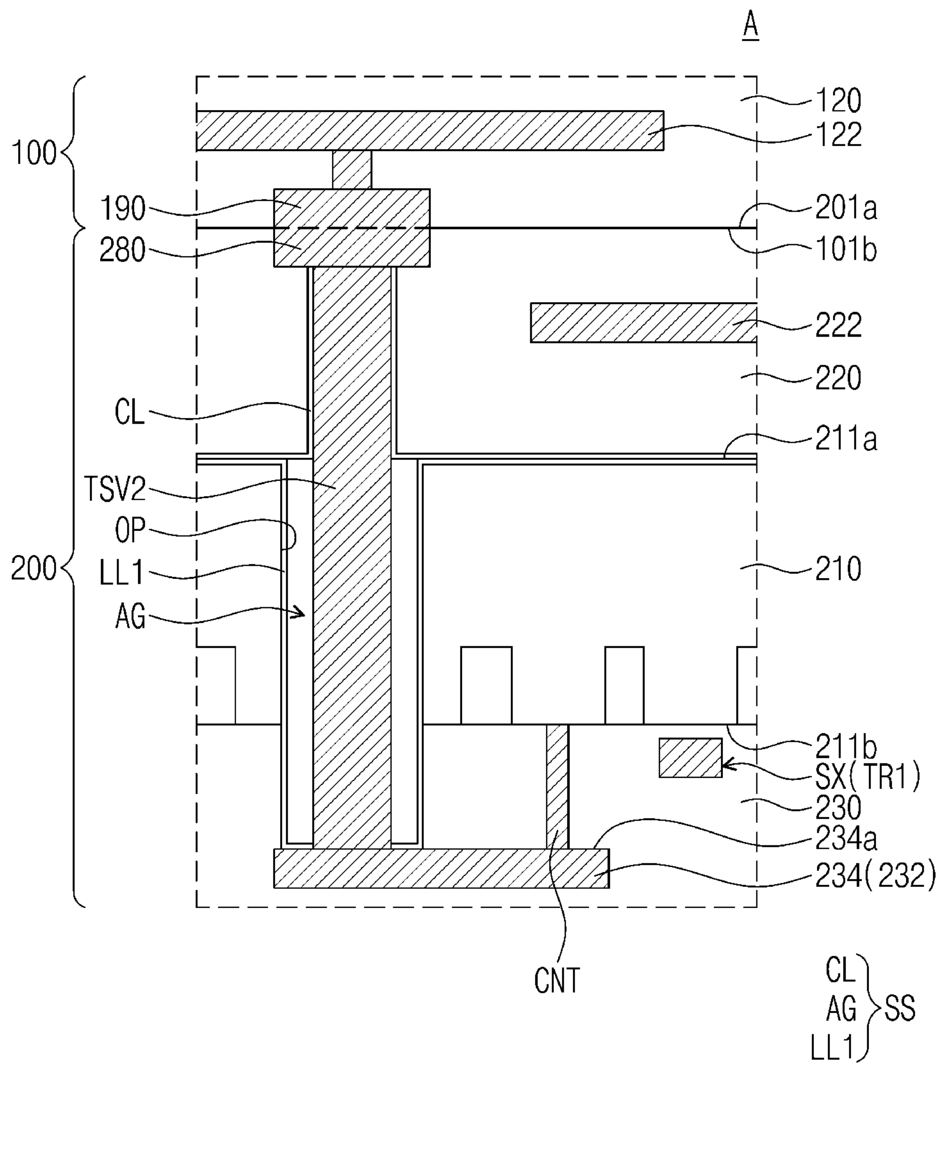
FIGS. 2 to 4 are enlarged views illustrating section A of FIG. 1.
Figure 3:
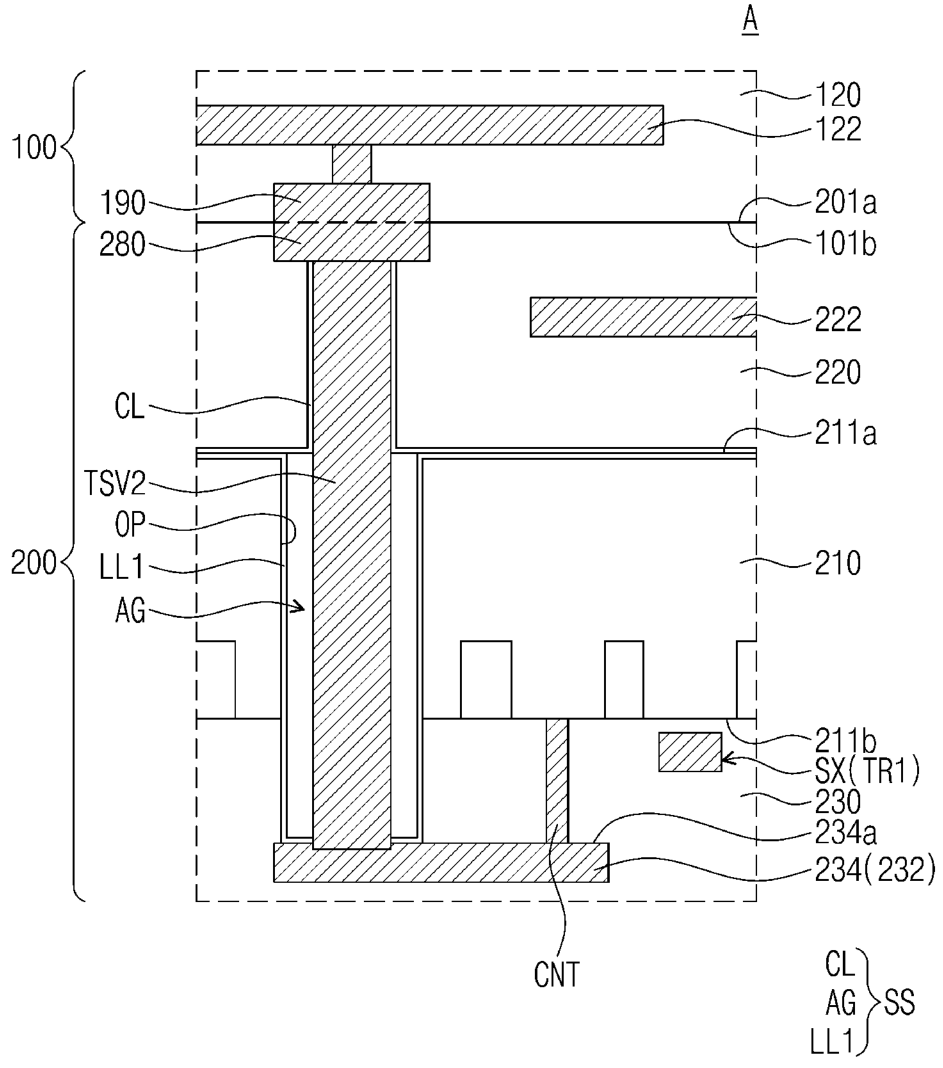
Figure 4:
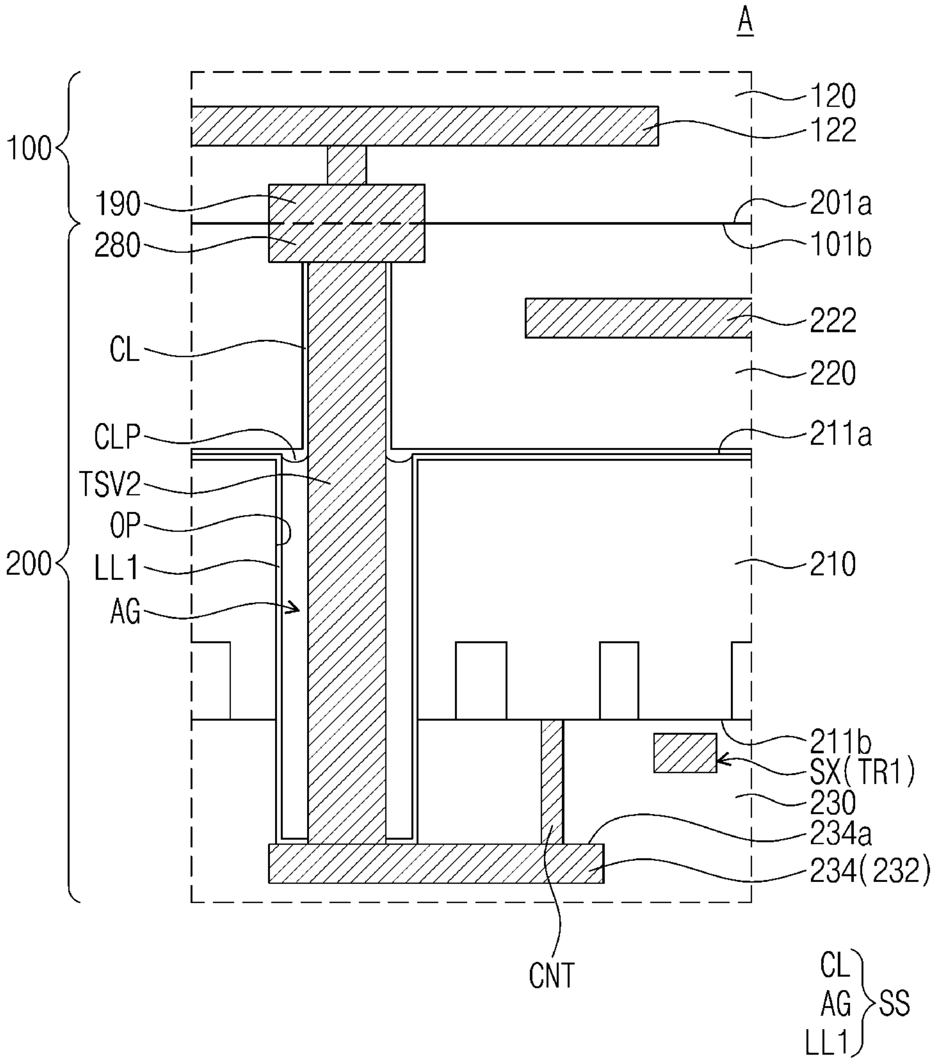
Figure 5:
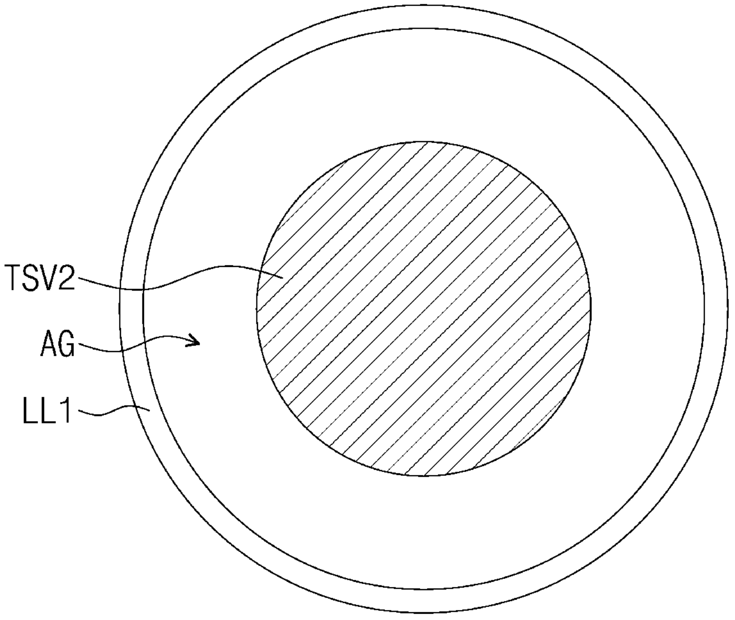
FIG. 5 is a plan view illustrating a spacer structure.

FIG. 1 is a cross-sectional view illustrating a semiconductor package according to some embodiments of the inventive concepts. FIGS. 2 to 4 are enlarged views illustrating section A of FIG. 1. FIG. 5 is a plan view illustrating a spacer structure. FIG. 1 omits a configuration of the spacer structure, and the spacer structure will be discussed in detail in FIGS. 2 to 4.

Referring to FIGS. 1 to 5, a semiconductor package 10 may include a first semiconductor chip 100, a second semiconductor chip 200 mounted below the first semiconductor chip 100, and a third semiconductor chip 300 mounted below the second semiconductor chip 200. The first, second, and third semiconductor chips 100, 200, and 300 may have different functions from each other. The first and second semiconductor chips 100 and 200 may have the same width as each other. The first and second semiconductor chips 100 and 200 may have their sidewalls coplanar or vertically aligned with each other. The first and second semiconductor chips 100 and 200 may be in contact with each other. The second and third semiconductor chips 200 and 300 may have the same width as each other. The second and third semiconductor chips 200 and 300 may have their sidewalls coplanar or vertically aligned with each other. The second and third semiconductor chips 200 and 300 may be in contact with each other.

The first semiconductor chip 100 may have a first top surface 101*a* and a first bottom surface 101*b*. The first semiconductor chip 100 may include a first upper conductive pad 180 disposed on the first top surface 101*a*. The first semiconductor chip 100 may include a first lower conductive pad 190 disposed adjacent to the first bottom surface 101*b*. The first upper conductive pad 180 and the first lower conductive pad 190 may be formed of metal, such as copper (Cu). The first semiconductor chip 100 may be, for example, an image sensor chip.

The second semiconductor chip 200 may have a second top surface 201*a* in contact with the first semiconductor chip 100 and a second bottom surface 201*b* directed toward or facing the third semiconductor chip 300. The second semiconductor chip 200 may include a second upper conductive pad 280 disposed adjacent to the second top surface 201*a*. The second semiconductor chip 200 may include a second lower conductive pad 290 disposed adjacent to the second bottom surface 201*b*. The second upper conductive pad 280 may be in contact with the first lower conductive pad 190. The second upper conductive pad 280 and the second lower conductive pad 290 may be formed of metal, such as copper (Cu). For example, the second semiconductor chip 200 may be a logic chip that drives the first semiconductor chip 100.

A direct bonding may be used to bond the second semiconductor chip 200 to the first semiconductor chip 100. For example, an intermetallic hybrid bonding may be made between the second upper conductive pad 280 of the second semiconductor chip 200 and the first lower conductive pad 190 of the first semiconductor chip 100. In this disclosure, the hybrid bonding may mean that two components including the same material are merged with each other at an interface between the two components or that a first component including a first material and a second component including a second material (or a compound of the first material) are merged with each other at an interface between the first component and the second component. For example, the second upper conductive pad 280 and the first lower conductive pad 190 may be in direct contact with each other, the second upper conductive pad 280 and the first lower conductive pad 190 may have a continuous configuration, and an invisible interface may be provided between the second upper conductive pad 280 and the first lower conductive pad 190. No passivation layer may be interposed between the first semiconductor chip 100 and the second semiconductor chip 200.

The third semiconductor chip 300 may have a third top surface 301*a* in contact with the second semiconductor chip 200. The third semiconductor chip 300 may include a third upper conductive pad 380 disposed adjacent to the third top surface 301*a*. The third upper conductive pad 380 may be in contact with the second lower conductive pad 290. The third upper conductive pad 380 and the second lower conductive pad 290 may be formed of metal, such as copper (Cu). The third semiconductor chip 300 may be, for example, a memory chip that stores data produced from the second semiconductor chip 200. For example, the third semiconductor chip 300 may be a dynamic random-access memory (DRAM) chip.

A direct bonding may be used to bond the third semiconductor chip 300 to the second semiconductor chip 200. For example, an intermetallic hybrid bonding may be made between the third upper conductive pad 380 of the third semiconductor chip 300 and the second lower conductive pad 290 of the second semiconductor chip 200. For example, the third upper conductive pad 380 and the second lower conductive pad 290 may be in direct contact with each other, the third upper conductive pad 380 and the second lower conductive pad 290 may have a continuous configuration, and an invisible interface may be provided between the third upper conductive pad 380 and the second lower conductive pad 290. No passivation layer may be interposed between the second semiconductor chip 200 and the third semiconductor chip 300.

FIG. 1 depicts that a direct bonding is made between the second semiconductor chip 200 and the third semiconductor chip 300, but the present inventive concepts are not limited thereto. The third semiconductor chip 300 may be flip-chip bonded to the second bottom surface 201*b* of the second semiconductor chip 200. For example, the second and third semiconductor chips 200 and 300 may be spaced apart from each other, and the second lower conductive pad 290 of the second semiconductor chip 200 and the third upper conductive pad 380 of the third semiconductor chip 300 may be electrically connected through connection means such as solder balls. A passivation may be provided to cover the third top surface 301*a* of the third semiconductor chip 300.

Hereinafter, a configuration of the first, second, and third semiconductor chips 100, 200, and 300 will be described in detail based on the embodiment of FIG. 1.

The first semiconductor chip 100 may include a first semiconductor substrate 110 and a first dielectric layer 120 disposed on the first semiconductor substrate 110. The first semiconductor chip 100 may be turned upside down to allow the first semiconductor substrate 110 to reside on the first dielectric layer 120. The first semiconductor substrate 110 may have a top surface that corresponds to the first top surface 101*a*. The first dielectric layer 120 may have a bottom surface that corresponds to the first bottom surface 101*b*.

The first semiconductor substrate 110 may include a semiconductor material. For example, the first semiconductor substrate 110 may be a silicon (Si) substrate.

The first semiconductor substrate 110 may be provided therein with deep device isolation layers DTI that separate a plurality of unit pixels UP from each other. Although not shown, the first semiconductor substrate 110 may include therein a plurality of photodiode regions each of which is disposed on a corresponding one of the unit pixels UP.

The first top surface 101*a* may be covered with a first passivation layer 114. The first passivation layer 114 may include, for example, a silicon nitride (SiN) layer or a polyimide (PI) layer.

The first passivation layer 114 may be provided thereon with color filters 150 that correspond to the unit pixels UP. A micro-lens array 140 may be disposed on the color filters 150. The first top surface 101*a* may be provided on its outer portion with the first upper conductive pad 180 spaced apart from the color filters 150. The first semiconductor substrate 110 may be provided thereon with a transfer gate TG which transfers charges created from the photodiode region.

The first dielectric layer 120 may cover a bottom surface of the first semiconductor substrate 110. The first dielectric layer 120 may be formed of a multiple layer including, for example, at least one selected from a silicon oxide (SiO) layer, a silicon nitride (SiN) layer, a silicon oxynitride (SiON) layer, and a porous low-k dielectric layer. The first dielectric layer 120 may include therein multi-layered first wiring patterns 122. The first wiring patterns 122 may be electrically connected to the first lower conductive pad 190. A portion of the first lower conductive pad 190 may be exposed on and coplanar with the first bottom surface 101*b*, or a bottom surface of the first dielectric layer 120.

The first semiconductor substrate 110 may include a first through via TSV1 that penetrates the first semiconductor substrate 110. The first through via TSV1 may penetrate a portion of the first dielectric layer 120 to come into electrical connection with the first wiring patterns 122 or the first lower conductive pad 190. The first through via TSV1 may be coupled to the first upper conductive pad 180.

A first via dielectric layer 112 may be disposed adjacent to the first through via TSV1. The first via dielectric layer 112 may be spaced apart from the first through via TSV1. Although not shown, when viewed in plan, the first via dielectric layer 112 may surround the first through via TSV1. The first via dielectric layer 112 may insulate the first through via TSV1 from the first semiconductor substrate 110. The first via dielectric layer 112 may penetrate the first semiconductor substrate 110.

The second semiconductor chip 200 may include a second semiconductor substrate 210, a second dielectric layer 220 on the second semiconductor substrate 210, and a third dielectric layer 230 below the second semiconductor substrate 210. The second dielectric layer 220 may have a top surface that corresponds to the second top surface 201*a*. The third dielectric layer 230 may have a bottom surface that corresponds to the second bottom surface 201*b*.

The second semiconductor substrate 210 may include a semiconductor material. For example, the second semiconductor substrate 210 may be a silicon (Si) substrate. The second semiconductor substrate 210 may have a first surface 211*a* directed toward or facing the first semiconductor chip 100 and a second surface 211*b* directed toward or facing the third semiconductor chip 300.

A plurality of first transistors TR1 may be disposed on the second semiconductor substrate 210. For example, the first transistors TR1 may be formed on the second surface 211*b* of the second semiconductor substrate 210. The first transistors TR1 may include logic transistors. The logic transistors may include a reset transistor, a selection transistor, and a drive transistor.

The second dielectric layer 220 may cover the first surface 211*a* of the second semiconductor substrate 210. The second dielectric layer 220 may be formed of a multiple layer including, for example, at least one selected from a silicon oxide (SiO) layer, a silicon nitride (SiN) layer, a silicon oxynitride (SiON) layer, and a porous low-k dielectric layer. The second dielectric layer 220 may include therein multi-layered second wiring patterns 222. The second wiring patterns 222 may be electrically connected to the second upper conductive pad 280. A portion of the second upper conductive pad 280 may be exposed on and coplanar with the second top surface 201*a*, or the top surface of the second dielectric layer 220.

The third dielectric layer 230 may cover the second surface 211*b* of the second semiconductor substrate 210, and may cover the first transistors TR1 on the second surface 211*b* of the second semiconductor substrate 210. The third dielectric layer 230 may be formed of a multiple layer including, for example, at least one selected from a silicon oxide (SiO) layer, a silicon nitride (SiN) layer, a silicon oxynitride (SiON) layer, and a porous low-k dielectric layer. The third dielectric layer 230 may include therein multi-layered third wiring patterns 232. The first transistors TR1 may be electrically connected to the third wiring patterns 232 in the third dielectric layer 230. For example, the third wiring patterns 232 may be connected to the first transistors TR1 through connection contacts CNT. The third wiring patterns 232 may be electrically connected to the second lower conductive pad 290. A portion of the second lower conductive pad 290 may be exposed on and coplanar with the second bottom surface 201*b*, or the bottom surface of the third dielectric layer 230.

The second semiconductor substrate 210 may include a second through via TSV2 that penetrates the second semiconductor substrate 210. The second through via TSV2 may penetrate a portion of the second dielectric layer 220 to come into electrical connection with the second wiring patterns 222 or the second upper conductive pad 280. The second through via TSV2 may penetrate a portion of the third dielectric layer 230 to come into electrical connection with the third wiring patterns 232. The first transistors TR1 may be electrically connected to the first semiconductor chip 100 through the connection contacts CNT, the third wiring patterns 232, the second through via TSV2, and the second upper conductive pad 280.

A configuration of the second through via TSV2 will be discussed in detail below with reference to FIG. 2.

Referring to FIGS. 2 to 5, the second semiconductor substrate 210 may have an opening OP that vertically penetrates the second semiconductor substrate 210. The opening OP may completely penetrate the second semiconductor substrate 210, and may penetrate a portion of the third dielectric layer 230 to expose a top surface 234*a* of one 234 of the third wiring patterns 232. The third wiring pattern 234 exposed by the opening OP may be connected through the connection contact CNT to the first transistors TR1. In this case, the second through via TSV2 may be a vertical connection terminal that directly connects the first semiconductor chip 100 to the first transistors TR1 of the second semiconductor chip 200. The first transistor TR1 connected to the second through via TSV2 may be a selection transistor SX. Differently from that shown in FIG. 2, the third wiring pattern 234 exposed by the opening OP may not be connected to the first transistors TR1. In this case, the second through via TSV2 may be a vertical connection terminal that directly connects the first semiconductor chip 100 to the third semiconductor chip 300.

The second through via TSV2 may be disposed in the opening OP. The second through via TSV2 may completely penetrate the second semiconductor substrate 210, and may penetrate a portion of the third dielectric layer 230 and a portion of the second dielectric layer 220. For example, the second through via TSV2 may extend along the opening OP to be coupled to the third wiring pattern 234, and may penetrate a portion of the second dielectric layer 220 to be coupled to the second upper conductive pad 280. The second through via TSV2 may be spaced apart from an inner lateral surface or inner side surface of the opening OP. For example, the second through via TSV2 may be spaced apart from the second semiconductor substrate 210 and the third dielectric layer 230. The second through via TSV2 may include a metallic material, such as tungsten (W).

A spacer structure SS may be provided adjacent to the second through via TSV2. The spacer structure SS may separate the second through via TSV2 from the second semiconductor substrate 210 and the third dielectric layer 230. The spacer structure SS may include a first liner layer LL1, a capping layer CL, and an air gap AG.

The first liner layer LL1 may conformally cover bottom and inner lateral or side surfaces of the opening OP. For example, the first liner layer LL1 may have a hollow cylindrical shape. As shown in FIG. 2, the second through via TSV2 may penetrate the first liner layer LL1 positioned on the bottom surface of the opening OP, thereby being coupled to the third wiring pattern 234. Alternatively, as shown in FIG. 3, the second through via TSV2 may penetrate the first liner layer LL1 positioned on the bottom surface of the opening OP, and may also penetrate a portion of the third wiring pattern 234. For example, the second through via TSV2 may be inserted into the third wiring pattern 234. The first liner layer LL1 positioned on the inner lateral surface of the opening OP may be spaced apart from the second through via TSV2. When viewed in plan as shown in FIG. 5, the first liner layer LL1 positioned on the inner lateral surface of the opening OP may surround the second through via TSV2. For example, the second through via TSV2 may vertically penetrate an inner space of the first liner layer LL1 shaped like a cylinder. The first liner layer LL1 may extend onto the first surface 211*a* of the second semiconductor substrate 210. On the first surface 211*a* of the second semiconductor substrate 210, the first liner layer LL1 may be interposed between the second semiconductor substrate 210 and the second dielectric layer 220. The first liner layer LL1 may include a dielectric material. The first liner layer LL1 may include a different material from that of the third dielectric layer 230. The first liner layer LL1 may include, for example, silicon nitride (SiN). Alternatively, the first liner layer LL1 may include silicon oxide (SiO) or silicon oxynitride (SiON).

The capping layer CL may be provided on a bottom surface of the second dielectric layer 220. Between the first surface 211*a* of the second semiconductor substrate 210 and the bottom surface of the second dielectric layer 220, the capping layer CL may be interposed between the first liner layer LL1 and the second dielectric layer 220. The capping layer CL may extend between the second dielectric layer 220 and the second through via TSV2. For example, the capping layer CL may cover the first liner layer LL1 on the first surface 211*a* of the second semiconductor substrate 210. The capping layer CL may separate the second through via TSV2 from the second dielectric layer 220. The capping layer CL may include a dielectric material. The capping layer CL may include a different material from that of the first liner layer LL1. The capping layer CL may include silicon oxide (SiO). Alternatively, the capping layer CL may include silicon nitride (SiN) or silicon oxynitride (SiON).

The air gap AG may be defined by the first liner layer LL1, the second through via TSV2, and the capping layer CL. For example, the air gap AG may be provided by the first liner layer LL1 shaped like a cylinder and the capping layer CL that covers an inner space of the first liner layer LL1, and the second through via TSV2 may vertically penetrate a center of the air gap AG. In this configuration, the capping layer CL may extend from the first surface 211*a* of the second semiconductor substrate 210 through an upper side of the air gap AG to between the second dielectric layer 220 and a lateral or side surface of the second through via TSV2. The air gap AG may be filled with vacuum or air. When viewed in a direction from the second through via TSV2 toward the first liner layer LL1, the air gap AG may have a width ranging from about 10 nm to about 10 μm. For example, the width of the air gap AG may range from about 10 nm to about 1 μm.

FIGS. 2 and 3 depict that a flat shape is given to the capping layer CL positioned on the bottom surface of the second dielectric layer 220, but the present inventive concepts are not limited thereto. As shown in FIG. 4, a portion CLP of the capping layer CL may extend into the air gap AG. For example, on the air gap AG, the portion CLP of the capping layer CL may protrude in a direction toward the third dielectric layer 230. The portion CLP of the capping layer CL may have a bottom end located at a lower vertical level than that of the first surface 211*a* of the second semiconductor substrate 210.

According to some embodiments of the present inventive concepts, the second through via TSV2 may penetrate the second semiconductor substrate 210 formed of silicon (Si), and the second through via TSV2 and the second semiconductor substrate 210 may be electrically insulated through the air gap AG whose dielectric constant is 1 or almost 1, which may result in achievement of superior electrical properties, compared to a case where the second through via TSV2 and the second semiconductor substrate 210 are electrically insulated from each other through a silicon oxide layer whose dielectric constant ranges from about 3.8 to about 4.2. For example, there may be a reduction in tunneling effect or parasitic capacitance between the second through via TSV2 and the second semiconductor substrate 210. Accordingly, the semiconductor package 10 may improve in electrical properties.

In addition, when the second through via TSV2 and the second semiconductor substrate 210 are formed of different materials from each other, a coefficient of thermal expansion (CTE) mismatch may cause distortion of the second through via TSV2. In this case, because the first liner layer LL1 and the air gap AG are present between the second through via TSV2 and the second semiconductor substrate 210, there may be essentially no risk of direct contact of the second through via TSV2 with the second semiconductor substrate 210. As discussed above, as the air gap AG can serve as a stress buffer, a stress may be vanished or reduced to a level which is insufficient to influence one or both of the second through via TSV2 and the second semiconductor substrate 210. As a result, the semiconductor package 10 may increase in structural stability.

Referring back to FIGS. 1 to 5, the third semiconductor chip 300 may include a third semiconductor substrate 310 and a fourth dielectric layer 320 on the third semiconductor substrate 310. The fourth dielectric layer 320 may have a top surface that corresponds to the third top surface 301*a*.

The third semiconductor substrate 310 may include a semiconductor material. For example, the third semiconductor substrate 310 may be a silicon (Si) substrate.

A plurality of second transistors TR2 may be disposed on the third semiconductor substrate 310. For example, the second transistors TR2 may be formed on a top surface of the third semiconductor substrate 310. The second transistors TR2 may include memory transistors.

The fourth dielectric layer 320 may cover a top surface of the third semiconductor substrate 310. The fourth dielectric layer 320 may be formed of a multiple layer including, for example, at least one selected from a silicon oxide (SiO) layer, a silicon nitride (SiN) layer, a silicon oxynitride (SiON) layer, and a porous low-k dielectric layer. The fourth dielectric layer 320 may be provided therein with multi-layered fourth wiring patterns 322 and capacitors including bottom electrodes. The second transistors TR2 may be electrically connected to the fourth wiring patterns 322 in the fourth dielectric layer 320. The fourth wiring patterns 322 may be electrically connected to the third upper conductive pad 380. A portion of the third upper conductive pad 380 may be exposed on and coplanar with the third top surface 301*a*, or the top surface of the fourth dielectric layer 320.

In the embodiments that follow, a detailed description of technical features repetitive to those discussed with reference to FIGS. 1 to 4 may be omitted for convenience of description and in the interest of brevity, and a difference thereof will be discussed in detail. The same reference numerals may be allocated to the same components as those of the semiconductor package according to some embodiments of the present inventive concepts.

Figure 6:
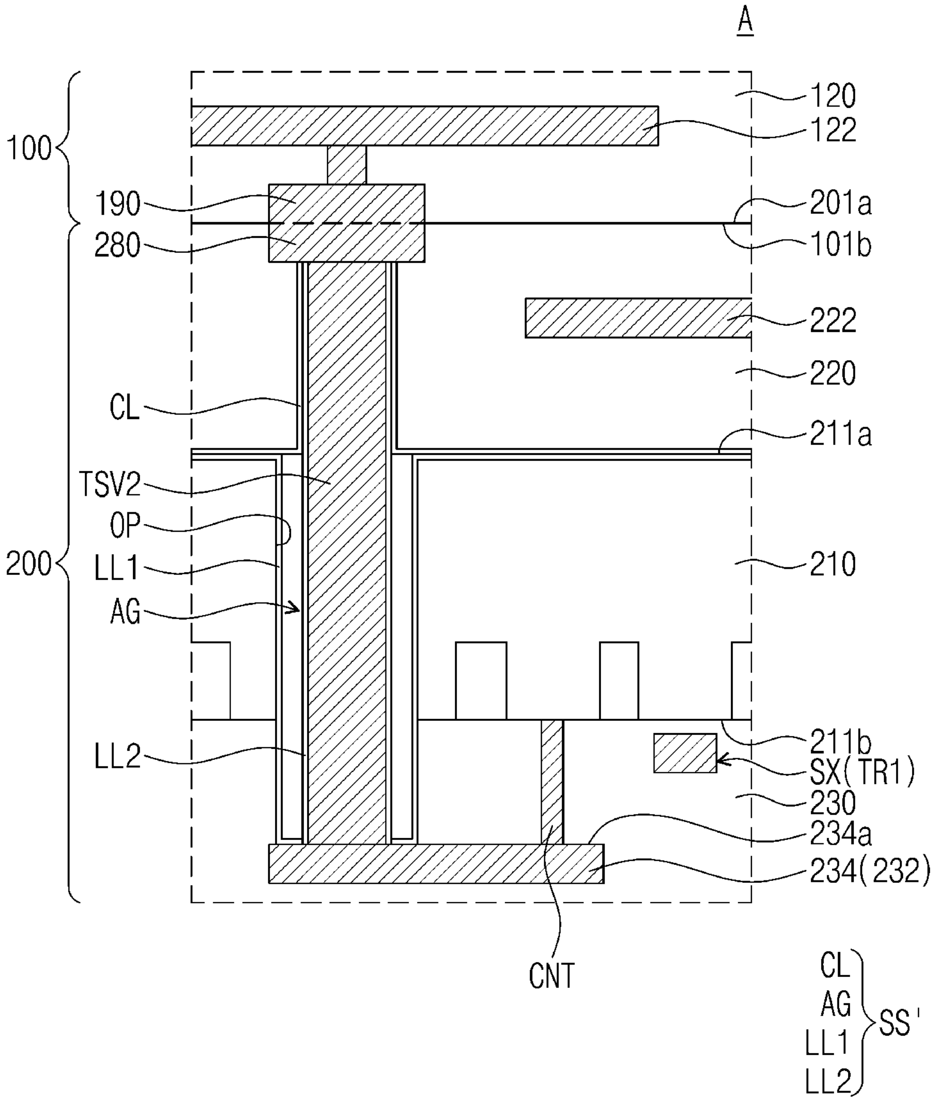
FIGS. 6 to 8 are enlarged views illustrating section A of FIG. 1.
Figure 7:
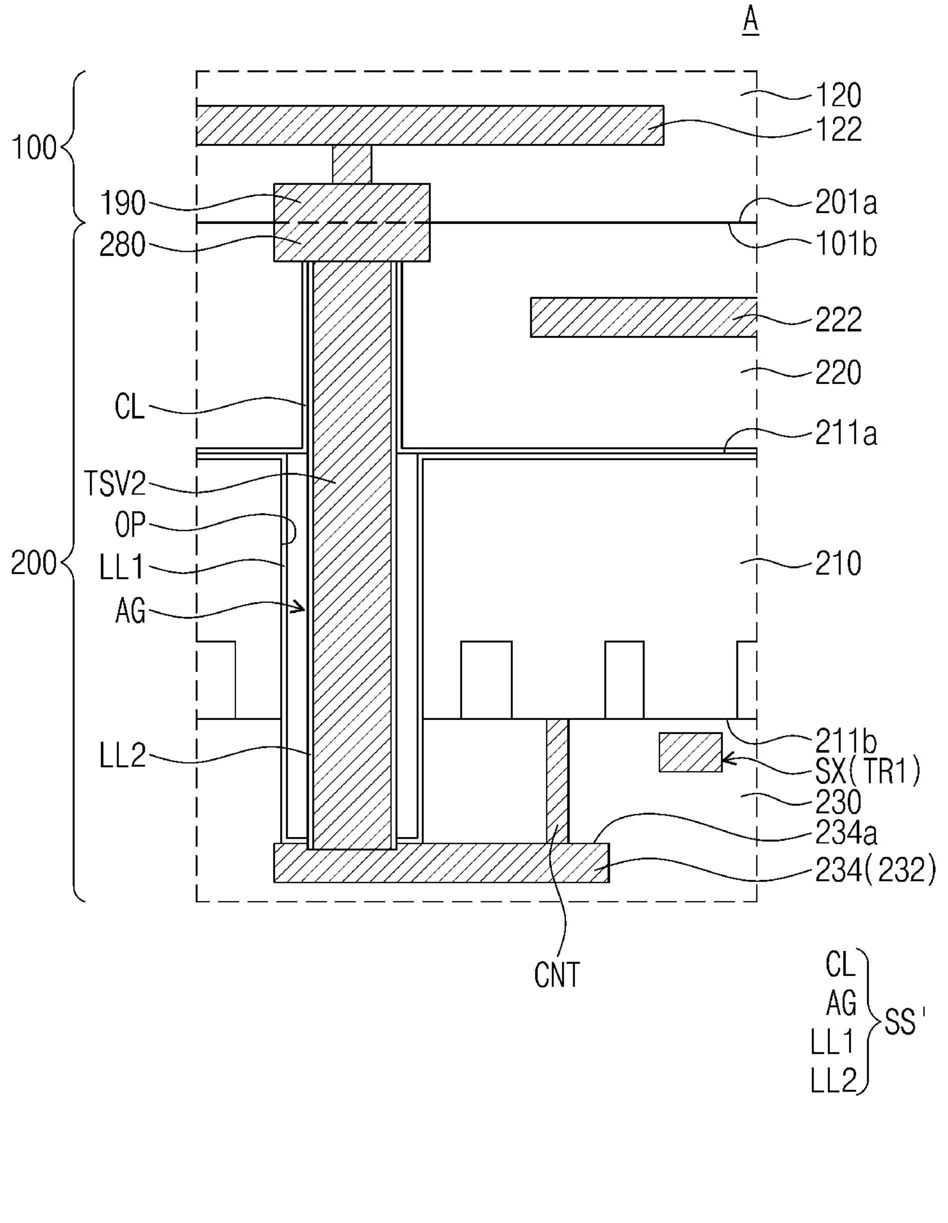
Figure 8:
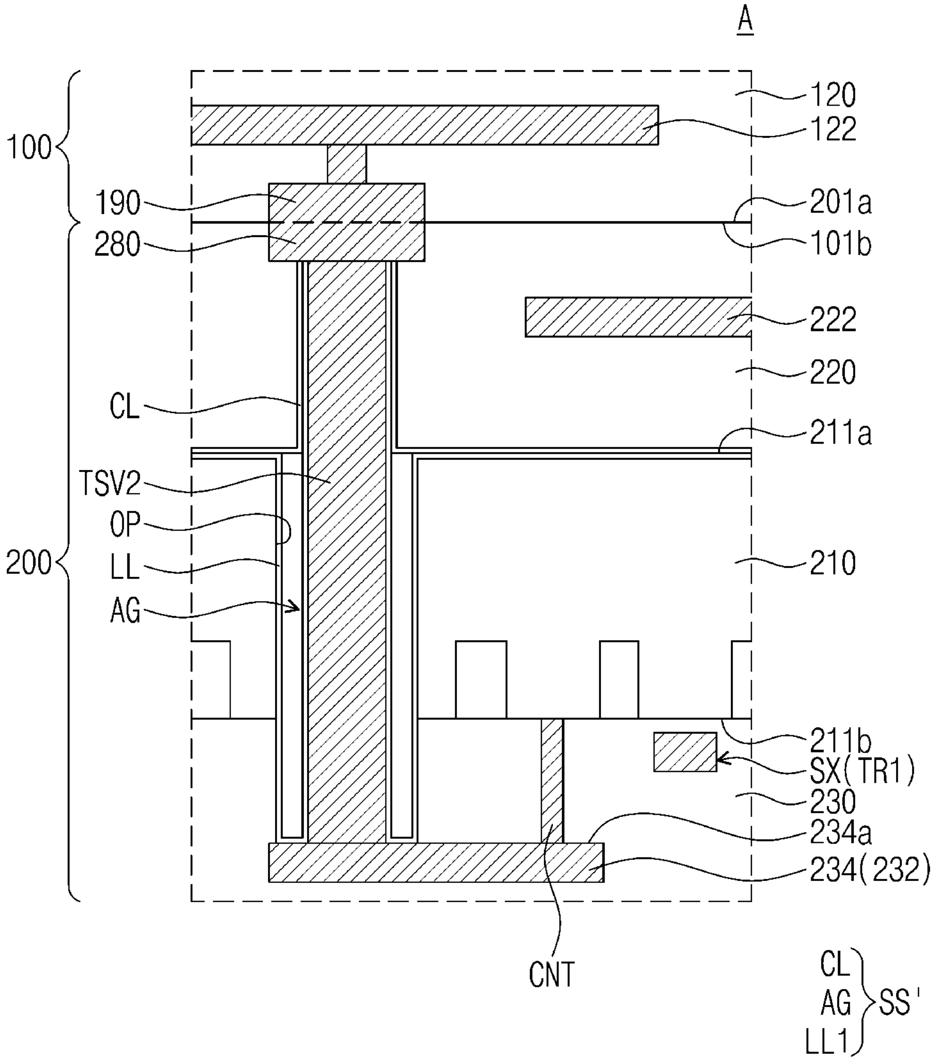
Figure 9:
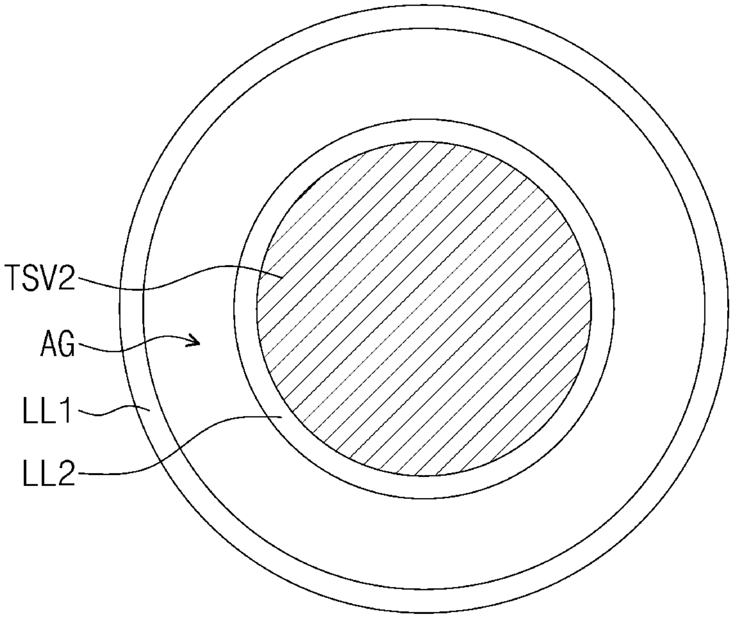
FIG. 9 is a plan view illustrating a spacer structure.

FIGS. 6 to 8 are enlarged views illustrating section A of FIG. 1. FIG. 9 is a plan view illustrating a spacer structure.

Referring to FIGS. 1 and 6 to 9, a spacer structure SS' may be provided adjacent to the second through via TSV2. The spacer structure SS' may separate the second through via TSV2 from the second semiconductor substrate 210 and the third dielectric layer 230. The spacer structure SS' may include a first liner layer LL1, a second liner layer LL2, a capping layer CL, and an air gap AG.

The first liner layer LL1 may conformally cover the bottom and inner lateral or side surfaces of the opening OP. As shown in FIG. 6, the second through via TSV2 may penetrate the first liner layer LL1 positioned on the bottom surface of the opening OP, thereby being coupled to the third wiring pattern 234. Alternatively, as shown in FIG. 7, the second through via TSV2 may penetrate the first liner layer LL1 positioned on the bottom surface of the opening OP, thereby being inserted into the third wiring pattern 234. The first liner layer LL1 positioned on the inner lateral surface of the opening OP may be spaced apart from the second through via TSV2. When viewed in plan as shown in FIG. 9, the first liner layer LL1 positioned on the inner lateral surface of the opening OP may surround the second through via TSV2. The first liner layer LL1 may extend onto the first surface 211*a* of the second semiconductor substrate 210.

The second liner layer LL2 may cover the lateral surface of the second through via TSV2. As shown in FIG. 9, the second liner layer LL2 may surround the second through via TSV2 and may contact the lateral surface of the second through via TSV2. In the second dielectric layer 220, the second liner layer LL2 may be interposed between the second dielectric layer 220 and the second through via TSV2. As shown in FIG. 6, the second liner layer LL2 may penetrate the first liner layer LL1 positioned on the bottom surface of the opening OP, thereby being coupled to the third wiring pattern 234. Alternatively, as shown in FIG. 7, the second liner layer LL2 may penetrate the first liner layer LL1 positioned on the bottom surface of the opening OP, thereby being inserted into the third wiring pattern 234. A bottom end of the second liner layer LL2 may be located at the same vertical level as that of a bottom end of the second through via TSV2. The second liner layer LL2 may be spaced apart from the first liner layer LL1 positioned on the inner lateral surface of the opening OP. The second liner layer LL2 may include a dielectric material. The second liner layer LL2 may include a different material from that of the third dielectric layer 230. The second liner layer LL2 may include, for example, silicon nitride (SiN). Alternatively, the second liner layer LL2 may include silicon oxide (SiO) or silicon oxynitride (SiON).

According to some embodiments, the first liner layer LL1 and the second liner layer LL2 may be provided as a single layer. As shown in FIG. 8, a liner layer LL may conformally cover the first surface 211*a* of the second semiconductor substrate 210, the bottom and inner lateral surfaces of the opening OP, and the lateral surface of the second through via TSV2. On the first surface 211*a* of the second semiconductor substrate 210, the liner layer LL may be interposed between the second semiconductor substrate 210 and the second dielectric layer 220. In the second dielectric layer 220, the liner layer LL may be interposed between the capping layer CL and the second through via TSV2. The following description will focus on the embodiment of FIG. 6.

The capping layer CL may be provided on a bottom surface of the second dielectric layer 220. Between the first surface 211*a* of the second semiconductor substrate 210 and the bottom surface of the second dielectric layer 220, the capping layer CL may be interposed between the first liner layer LL1 and the second dielectric layer 220. The capping layer CL may extend between the second dielectric layer 220 and the second through via TSV2, for example, between the second dielectric layer 220 and the second liner layer LL2. For example, the capping layer CL may cover the first liner layer LL1 on the first surface 211*a* of the second semiconductor substrate 210. The capping layer CL and the second liner layer LL2 may separate the second through via TSV2 from the second dielectric layer 220.

The air gap AG may be defined by the first liner layer LL1, the second liner layer LL2, and the capping layer CL. For example, the air gap AG may be provided by the first liner layer LL1 shaped like a cylinder and the capping layer CL that covers an inner space of the first liner layer LL1, and the second through via TSV2 and the second liner layer LL2 may vertically penetrate a center of the air gap AG. In this configuration, the capping layer CL may extend from the first surface 211*a* of the second semiconductor substrate 210 through an upper side of the air gap AG to between the second dielectric layer 220 and the second liner layer LL2. The air gap AG may be filled with vacuum or air. When viewed in a direction from the second through via TSV2 toward the first liner layer LL1, the air gap AG may have a width ranging from about 10 nm to about 1 μm.

FIGS. 6 and 7 depict that a flat shape is given to the capping layer CL positioned on the bottom surface of the second dielectric layer 220, but the present inventive concepts are not limited thereto. A portion of the capping layer CL may extend into the air gap AG. For example, on the air gap AG, the portion of the capping layer CL may protrude in a direction toward the third dielectric layer 230. The portion of the capping layer CL may have a bottom end located at a lower vertical level than that of the first surface 211*a* of the second semiconductor substrate 210.

According to some embodiments of the present inventive concepts, as the second through via TSV2 and the second semiconductor substrate 210 are electrically insulated from each other through the air gap AG, extremely excellent electrical properties may be achieved. Moreover, when the second through via TSV2 formed of tungsten (W) or copper (Cu) which is easily and extremely diffusive, the second liner layer LL2 including nitride (e.g., silicon nitride (SiN)) may additionally serve as a barrier that prevents diffusion of tungsten (W) or copper (Cu). Furthermore, when the second through via TSV2 is remarkably distorted, the second liner layer LL2 may usually be preferentially fractured. As discussed above, as the second liner layer LL2 serves as a stress buffer, a stress may disappear or be reduced to a level which is insufficient to influence one or both of the second through via TSV2 and the second semiconductor substrate 210.

Figure 10:
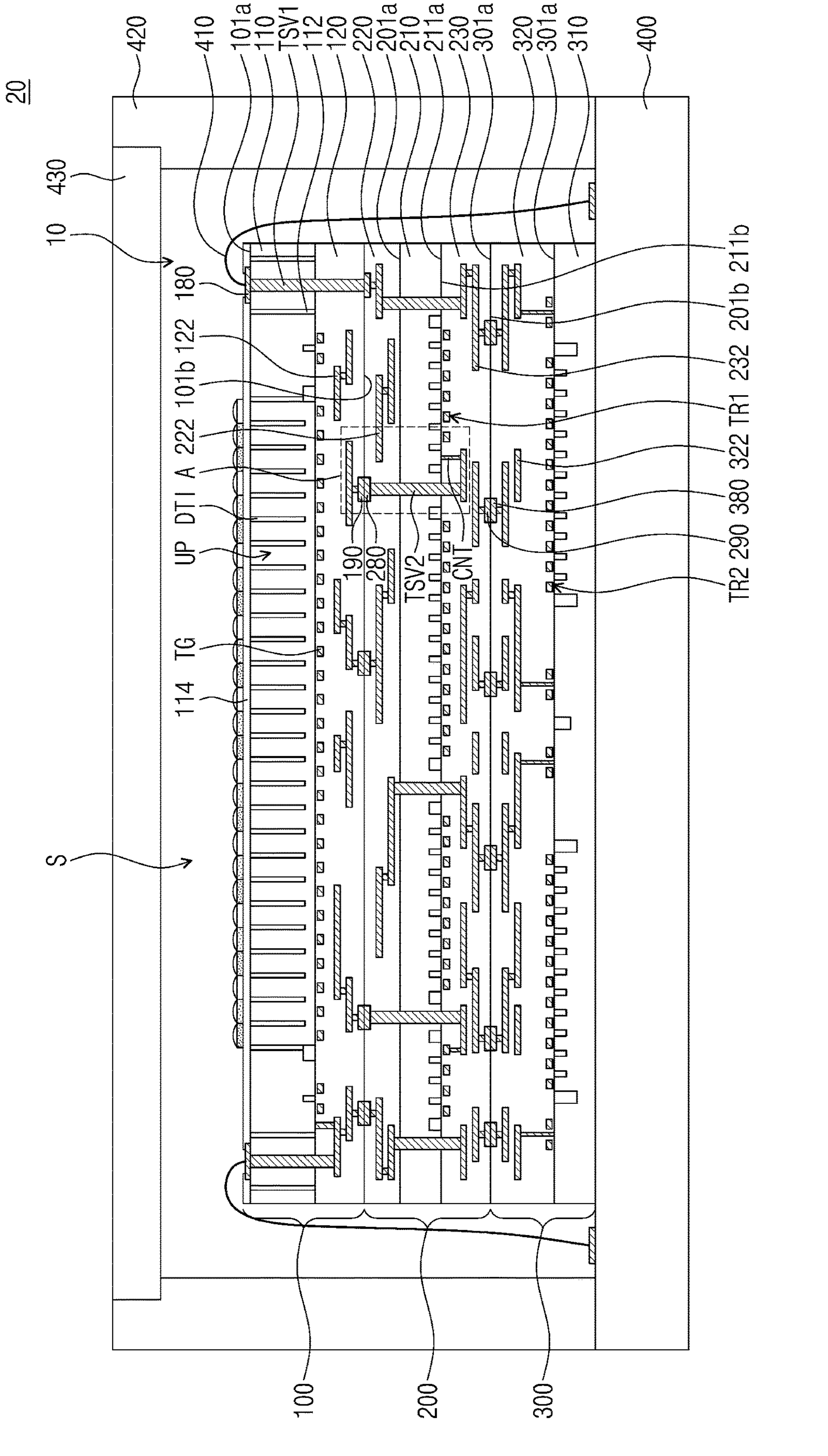
FIG. 10 is a cross-sectional view illustrating a semiconductor module according to some embodiments of the inventive concepts.

FIG. 10 is a cross-sectional view illustrating a semiconductor module according to some embodiments of the inventive concepts.

Referring to FIG. 10, a semiconductor module 20 according to the present embodiment may be configured such that the semiconductor package 10 of FIG. 1 may be attached through an adhesion layer to a package substrate 400. The adhesion layer may be interposed between the third semiconductor chip 300 and the package substrate 400. A wire 410 may be provided to connect the package substrate 400 to the first upper conductive pad 180 of the first semiconductor chip 100. A holder 420 may be disposed on the package substrate 400. The holder 420 may be spaced apart from the semiconductor package 10. The holder 420 may be attached through an adhesion layer to the package substrate 400. The holder 420 may have a closed loop shape when viewed in plan. The holder 420 may have a hollow structure adjacent to an edge of the semiconductor package 10. The holder 420 may be formed of a polymeric material, such as polyamide. A transparent substrate 430 may be attached through an adhesion layer to the holder 420. The transparent substrate 430 may be formed of transparent glass or plastic. The transparent substrate 430 may be spaced apart from the semiconductor package 10, providing an empty space S. Although not shown, external connection terminals, such as solder bumps, may be attached to a lower portion of the package substrate 400. FIG. 10 depicts that the semiconductor package 10 of FIG. 1 is attached, but the semiconductor package 10 may be one of the semiconductor packages discussed with reference to FIGS. 2 to 9. Alternatively, the semiconductor package 10 may include a combination of the semiconductor packages discussed above.

FIGS. 11A to 20A are cross-sectional views illustrating a method of fabricating a semiconductor package according to some embodiments of the inventive concepts. FIGS. 11B to 20B are enlarged views illustrating section B of FIGS. 11A to 20A, respectively. FIGS. 14C, 16C, 18C, and 19C are enlarged views of section B respectively depicted in FIGS. 14A, 16A, 18A, and 19A, illustrating other examples of FIGS. 14B, 16B, 18B, and 19B, respectively. FIGS. 11A to 20A, 11B to 20B, 14C, 16C, 18C, and 19C explain a method of fabricating a semiconductor package, for example, a method of forming a second semiconductor chip. FIGS. 11A to 20A omit a configuration of a spacer structure, and the spacer structure will be discussed in detail in FIGS. 11B to 20B, 14C, 16C, 18C, and 19C.

Figure 11A:
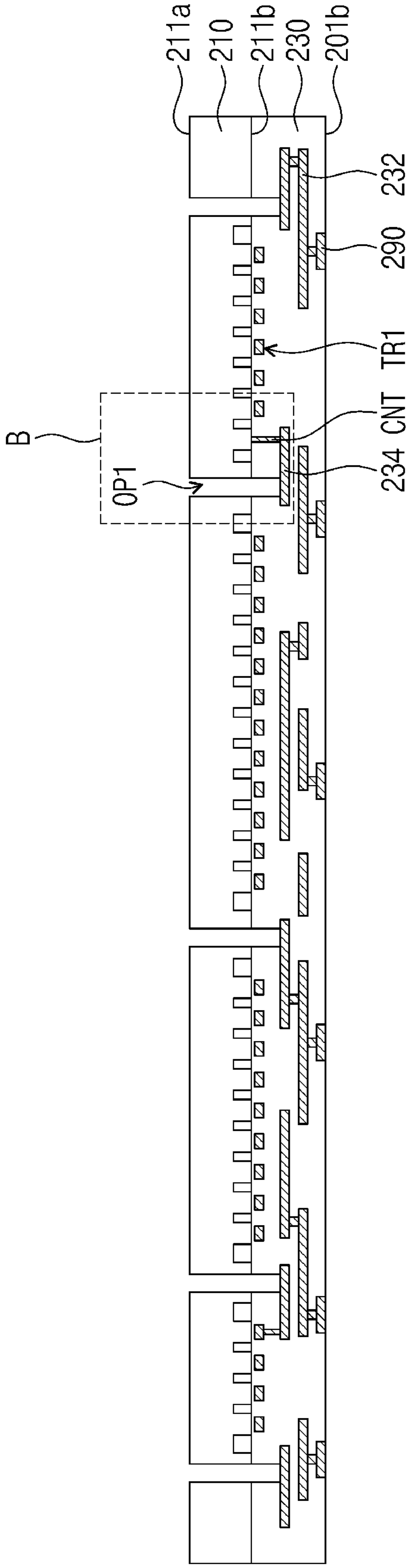
Figure 11B:
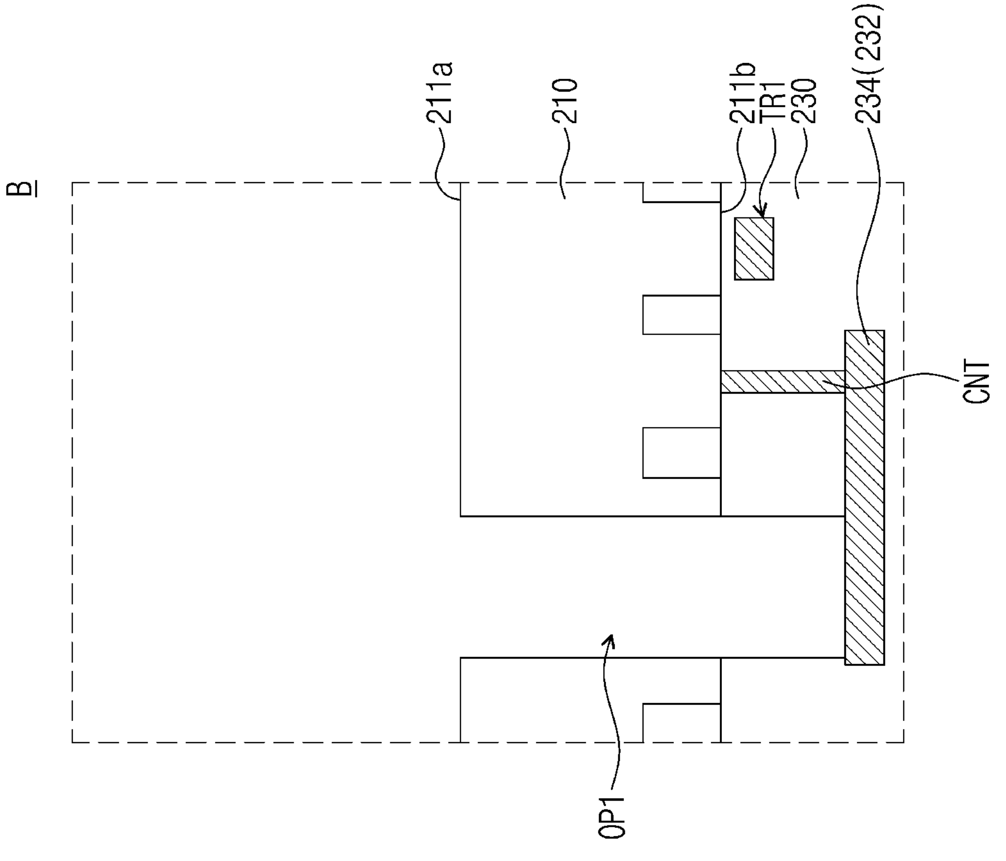

Referring to FIGS. 1, 11A, and 11B, a second semiconductor substrate 210 may be provided. The second semiconductor substrate 210 may include a semiconductor material. The second semiconductor substrate 210 may have a first surface 211*a* and a second surface 211*b* that are opposite to each other. First transistors TR1 may be formed on the second surface 211*b* of the second semiconductor substrate 210.

A third dielectric layer 230 and third wiring patterns 232 may be formed on the second semiconductor substrate 210. For example, a dielectric material covering the first transistors TR1 may be coated on the second surface 211*b* of the second semiconductor substrate 210, thereby forming one dielectric layer. A conductive layer may be formed on the dielectric layer, and then the conductive layer may be patterned to form one wiring layer. The formation of the dielectric layer and the conductive layer may be repeated to form the third dielectric layer 230 and the third wiring patterns 232. A second lower conductive pad 290 may be formed on a lowermost dielectric layer, and the second lower conductive pad 290 may be connected to the third wiring patterns 232 and surrounded by the third dielectric layer 230. The third wiring patterns 232 may be connected to the first transistors TR1. The third dielectric layer 230 may include silicon oxide (SiO).

Afterwards, a first opening OP1 may be formed on the second semiconductor substrate 210. The first opening OP1 may correspond to the opening OP discussed with reference to FIG. 2. For example, a mask pattern may be formed on the first surface 211*a* of the second semiconductor substrate 210, and then the mask pattern may be used as an etching mask to etch the second semiconductor substrate 210. In this step, a portion of the third dielectric layer 230 may be etched together with the second semiconductor substrate 210. Therefore, the first opening OP1 may completely penetrate the second semiconductor substrate 210, and may penetrate a portion of the third dielectric layer 230 to expose the third wiring pattern 234.

Figure 12A:
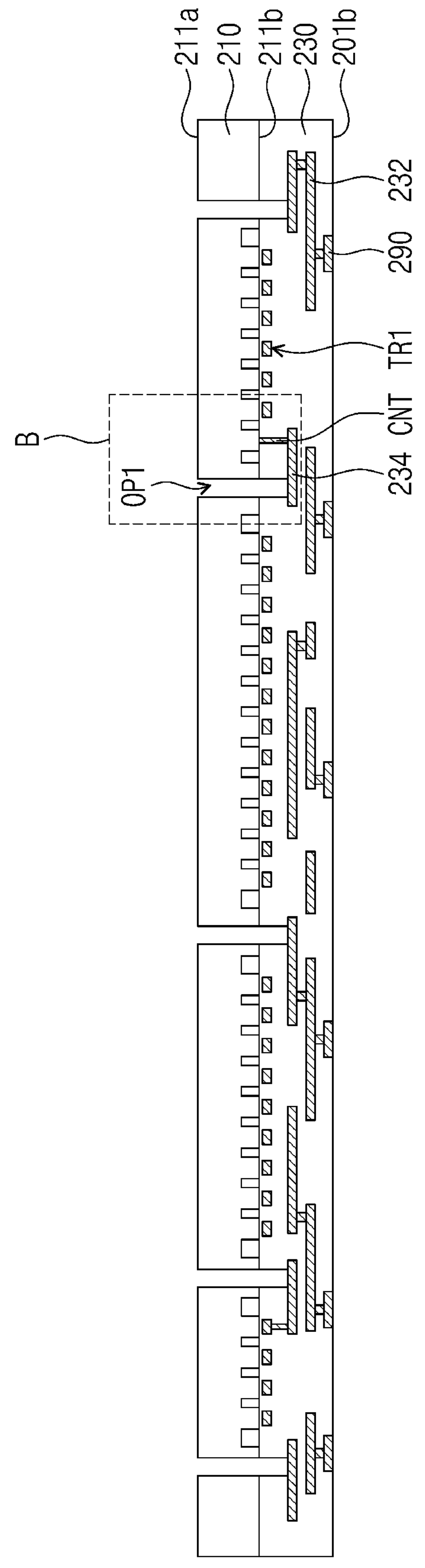
Figure 12B:
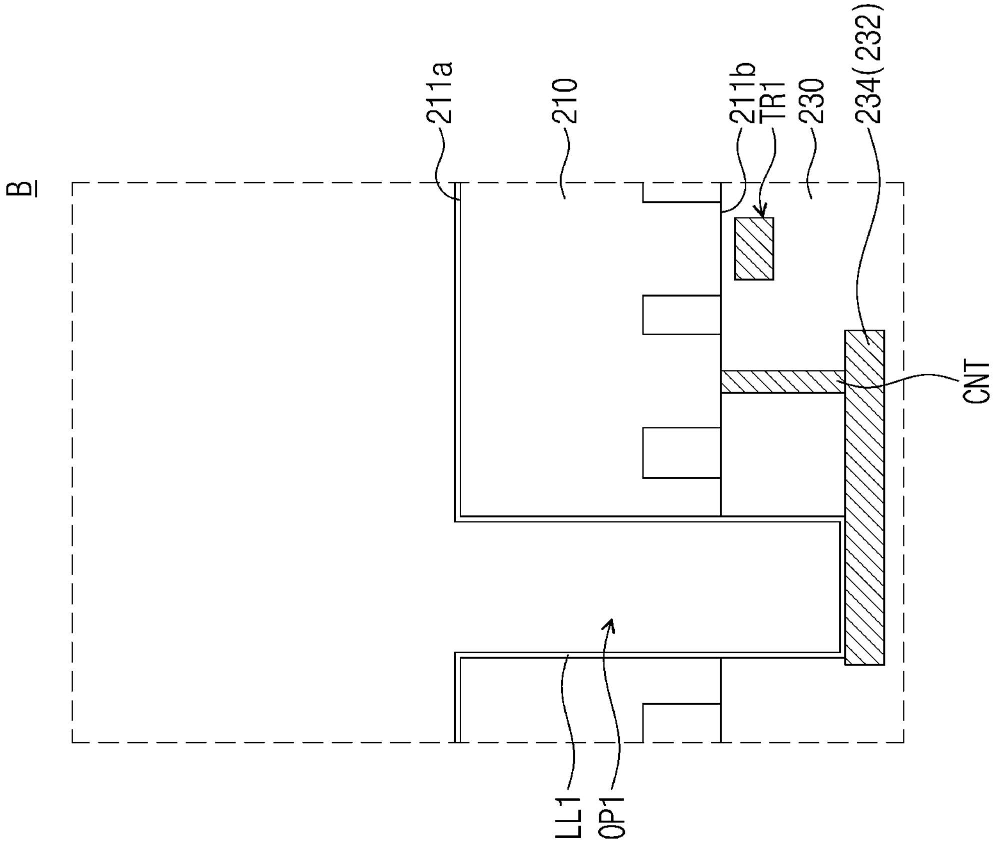

Referring to FIGS. 1, 12A, and 12B, a first liner layer LL1 may be formed on the second semiconductor substrate 210. For example, the first liner layer LL1 may be formed by depositing a dielectric material on the first surface 211*a* of the second semiconductor substrate 210. The first liner layer LL1 may conformally cover the first surface 211*a* of the second semiconductor substrate 210, an inner lateral or side surface of the first opening OP1, and a bottom surface of the first opening OP1. The first liner layer LL1 may include silicon nitride (SiN) or silicon oxynitride (SiON).

Figure 13A:
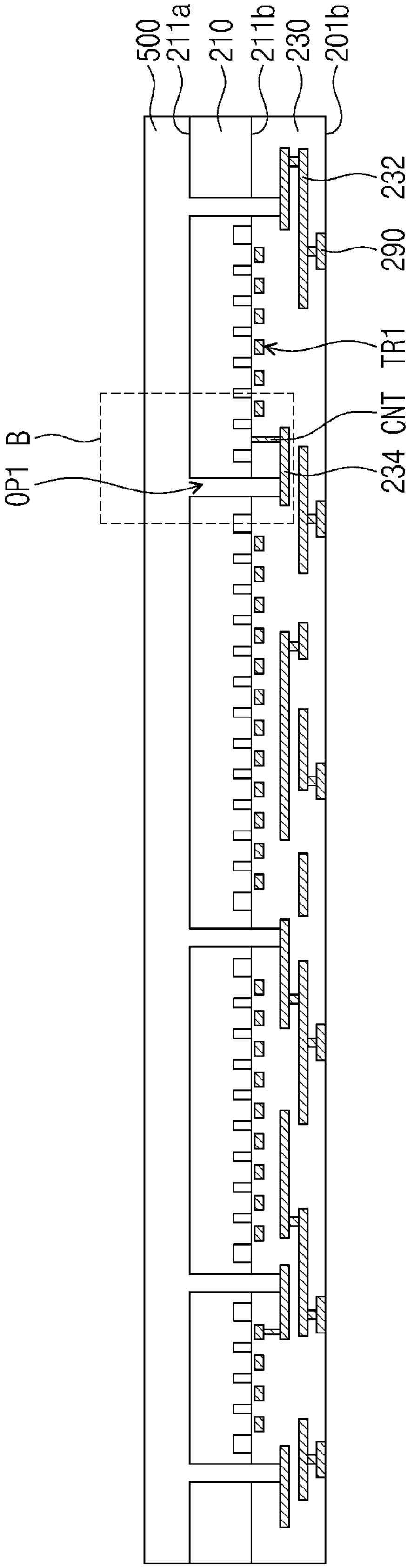
Figure 13B:
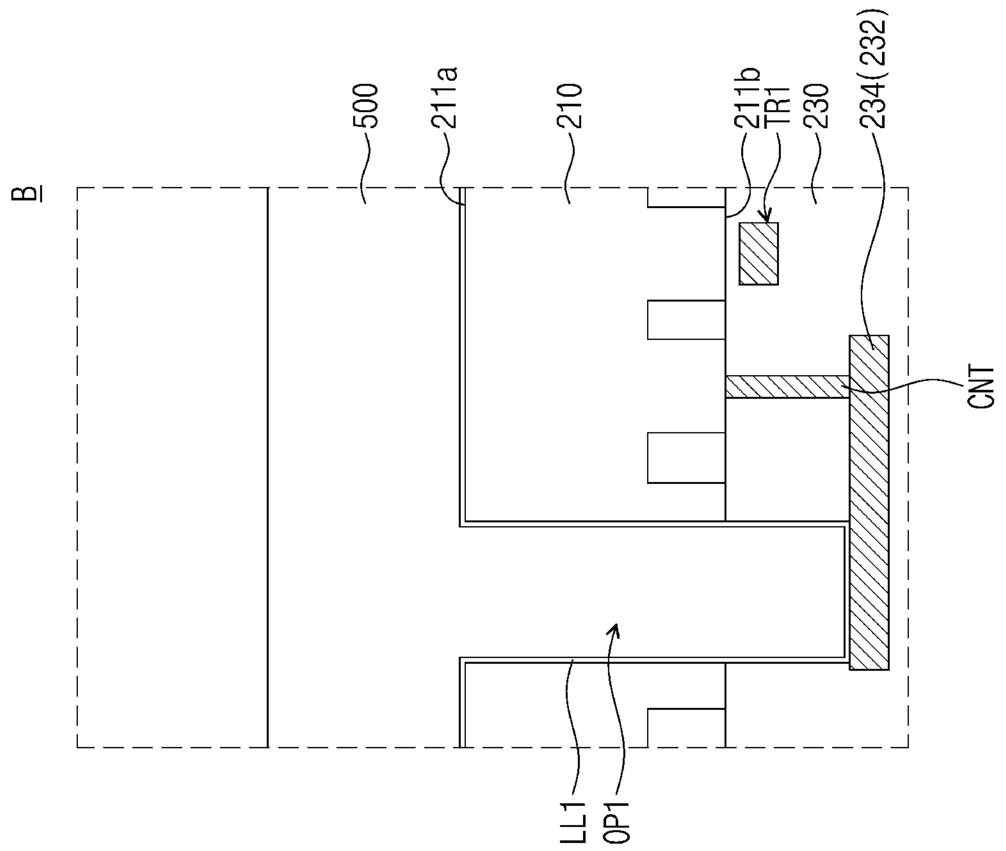

Referring to FIGS. 1, 13A, and 13B, a sacrificial layer 500 may be formed on the second semiconductor substrate 210. For example, the sacrificial layer 500 may be formed by coating or depositing a dielectric material on the first surface 211*a* of the second semiconductor substrate 210. The dielectric material may cover the first liner layer LL1. For example, the dielectric material may cover the first surface 211*a* of the second semiconductor substrate 210 and may fill the first opening OP1. The dielectric material may have an etch selectivity with respect to the first liner layer LL1. For example, the dielectric material may include silicon oxide (SiO).

Figure 14A:
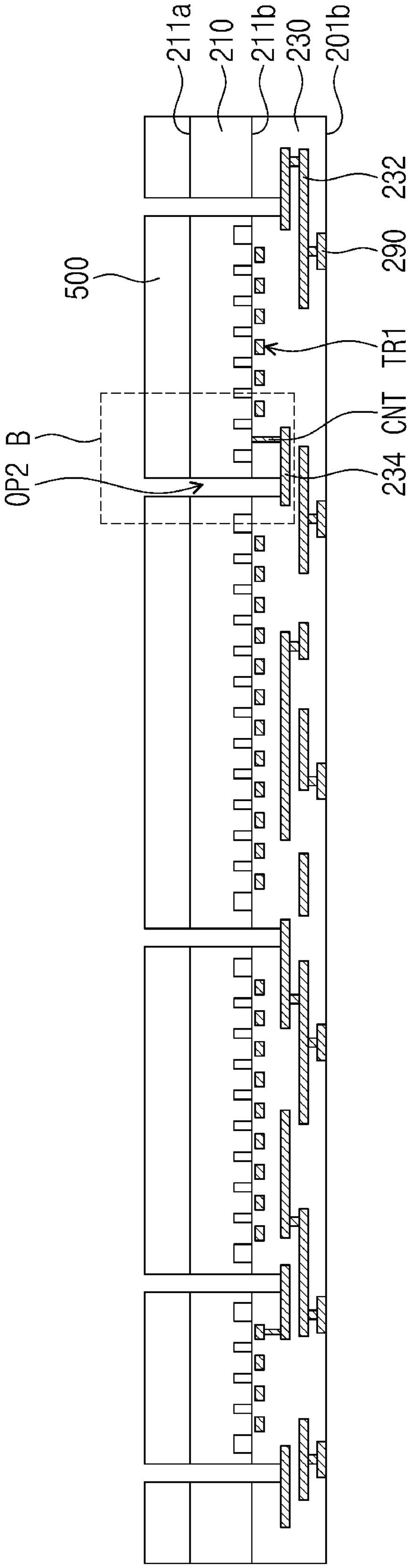
Figure 14C:
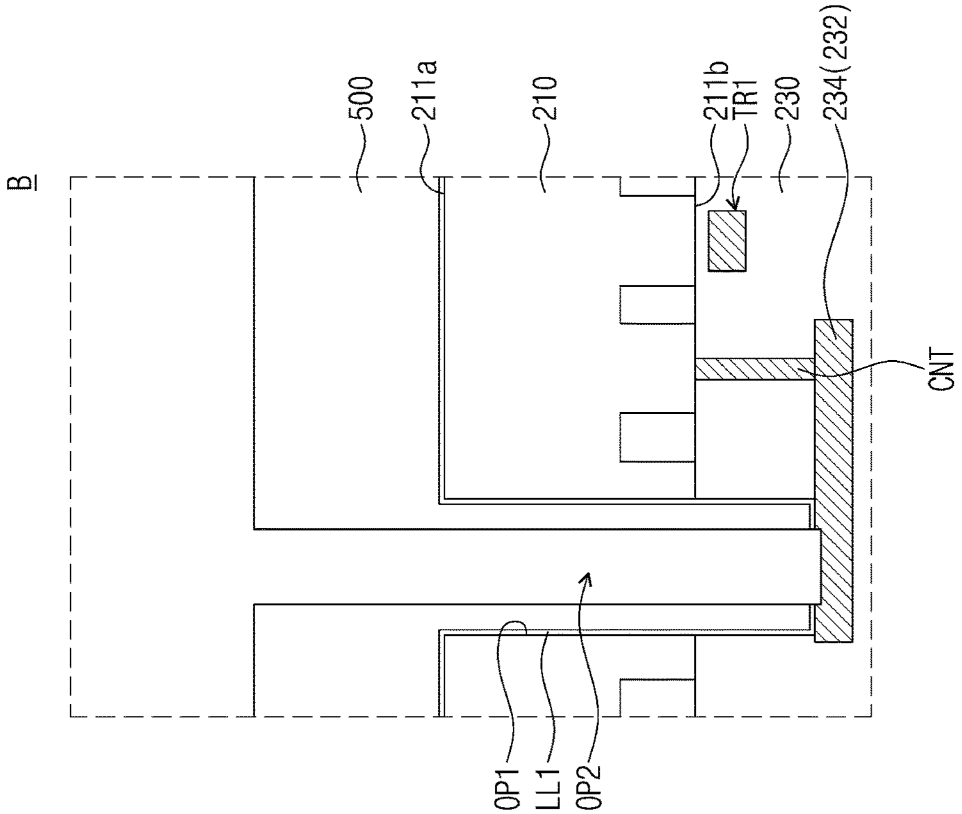
FIGS. 14C, 16C, 18C, and 19C are enlarged views of section B respectively depicted in FIGS. 14A, 16A, 18A, and 19A, illustrating other examples of FIGS. 14B, 16B, 18B, and 19B, respectively.
Figure 14B:
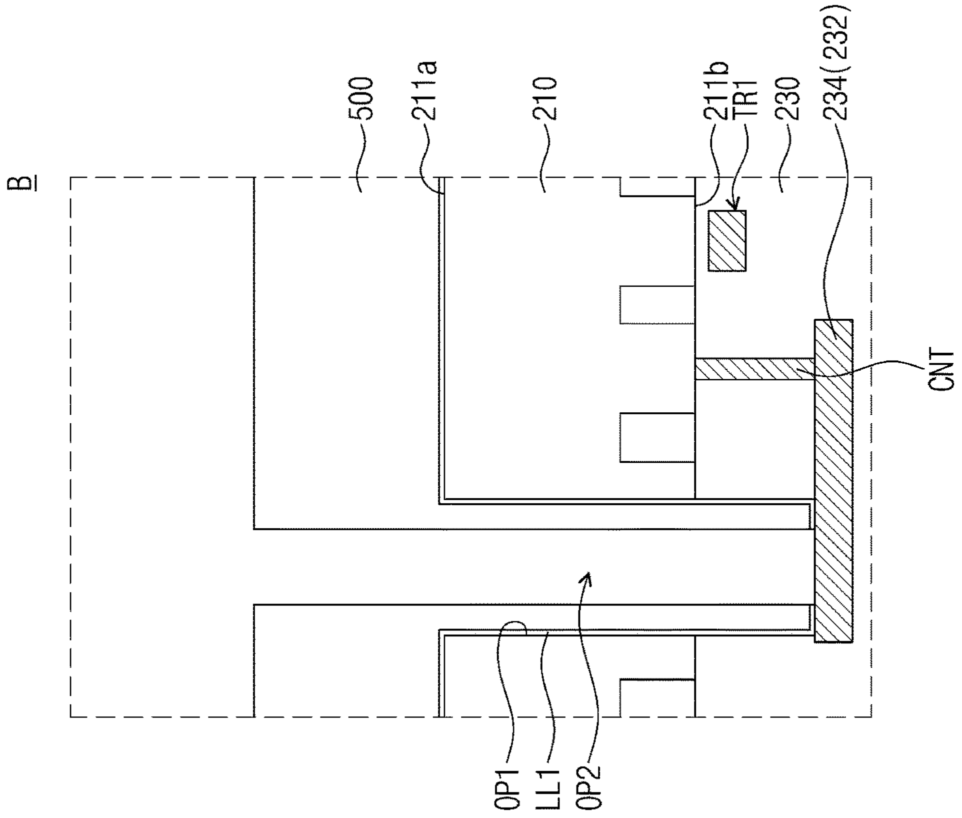

Referring to FIGS. 1, 14A, and 14B, the sacrificial layer 500 may be etched to form a second opening OP2. For example, a mask pattern may be formed on the sacrificial layer 500, and then the mask pattern may be used as an etching mask to etch the sacrificial layer 500. The second opening OP2 may be positioned within the first opening OP1. The second opening OP2 may be spaced apart from the first liner layer LL1 positioned on the inner lateral surface of the first opening OP1. For example, the sacrificial layer 500 may remain between the second opening OP2 and the first liner layer LL1 positioned on the inner lateral surface of the first opening OP1. On the bottom surface of the first opening OP1, a portion of the first liner layer LL1 may be etched together with the sacrificial layer 500. Therefore, the second opening OP2 may expose the third wiring pattern 234.

FIG. 14B depicts that, on the third wiring pattern 234, the portion of the first liner layer LL1 is etched together with the sacrificial layer 500, but the present inventive concepts are not limited thereto. As shown in FIG. 14C, on the bottom surface of the first opening OP1, a portion of the third wiring pattern 234 may be etched together with the sacrificial layer 500 and the portion of the first liner layer LL1. For example, the second opening OP2 may penetrate the sacrificial layer 500 and the first liner layer LL1 to extend into the third wiring pattern 234. According to FIG. 14C, a semiconductor package may be fabricated as is discussed with reference to FIG. 3. The following will further describe the embodiment of FIG. 14B.

Figure 15A:
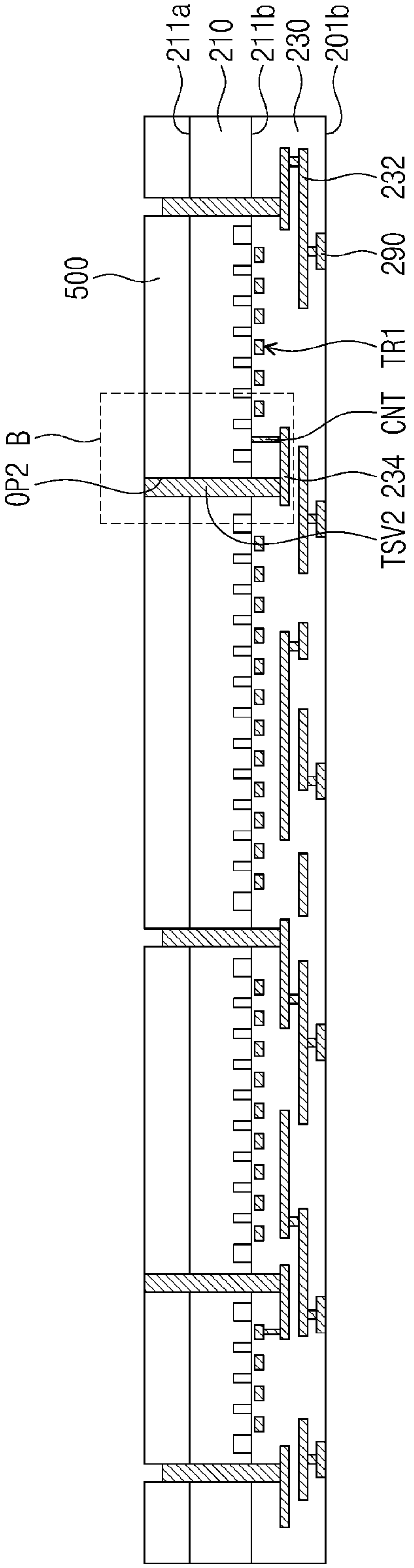
Figure 15B:
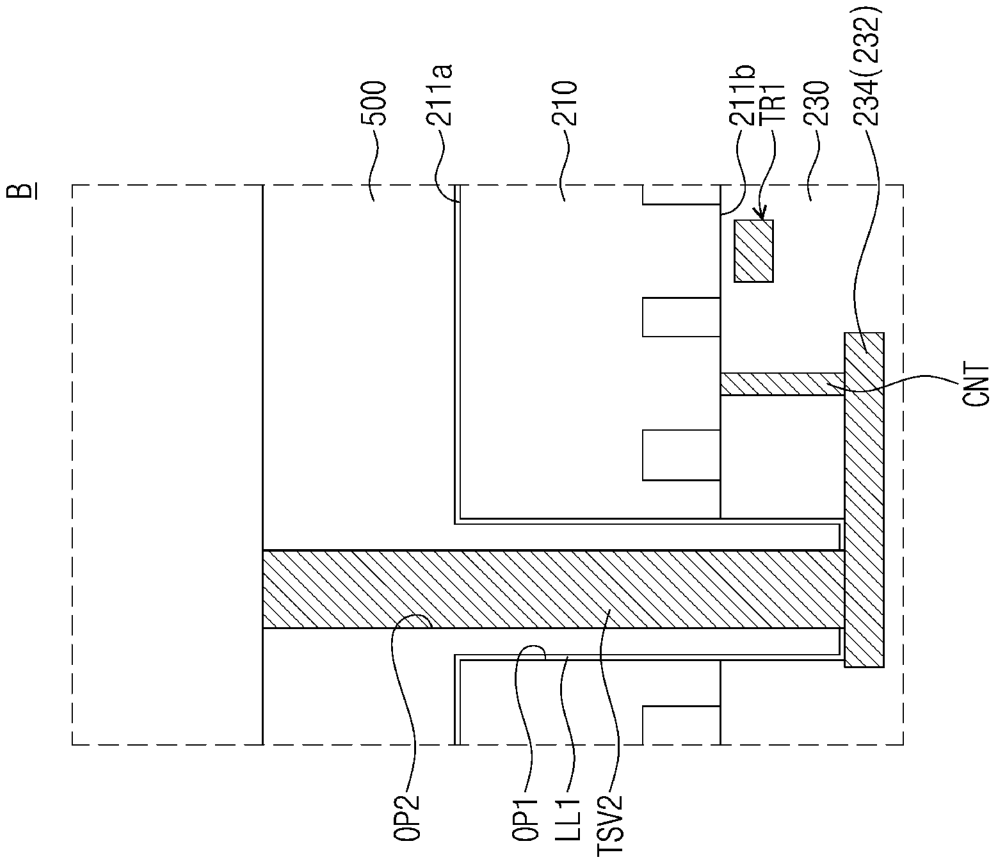

Referring to FIGS. 1, 15A, and 15B, a second through via TSV2 may be formed in the second opening OP2. For example, the second opening OP2 may be filled with a conductive material to form the second through via TSV2. For more detail, a conductive layer may be formed on the sacrificial layer 500. The conductive layer may cover a top surface of the sacrificial layer 500 and may fill the second opening OP2. Thereafter, a planarization process may be performed on the sacrificial layer 500 until the top surface of the sacrificial layer 500 is exposed. After the planarization process, the conductive layer remaining in the second opening OP2 may be formed into the second through via TSV2. The second through via TSV2 may be coupled to the third wiring pattern 234.

FIGS. 15A and 15B depict that the second liner layer (see LL2 of FIG. 6) is not formed, and that the first liner layer LL1 and the second through via TSV2 are formed, but the present inventive concepts are not limited thereto.

Figure 16A:
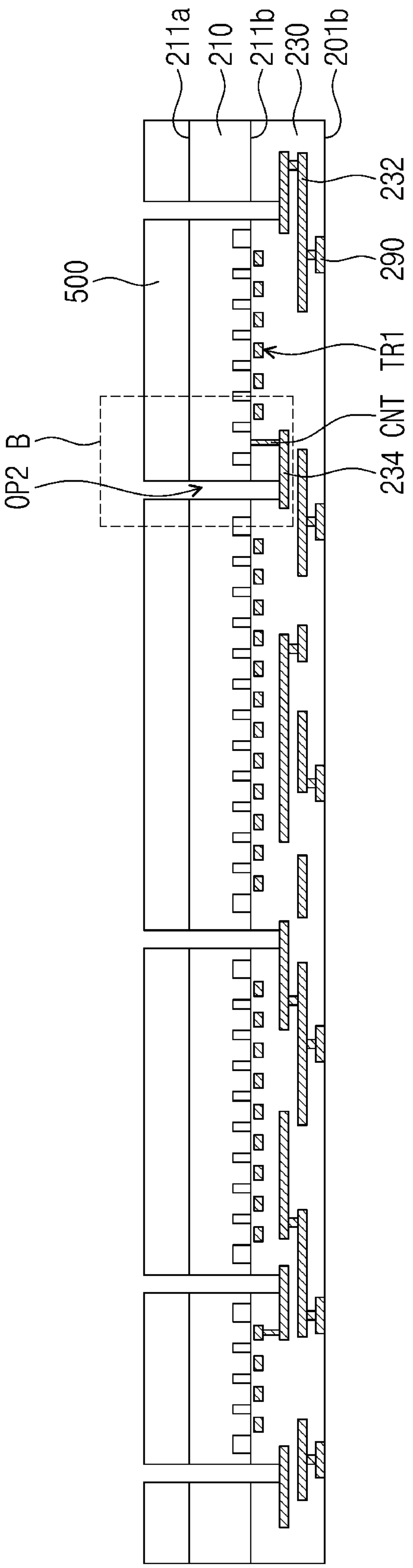
Figure 16C:
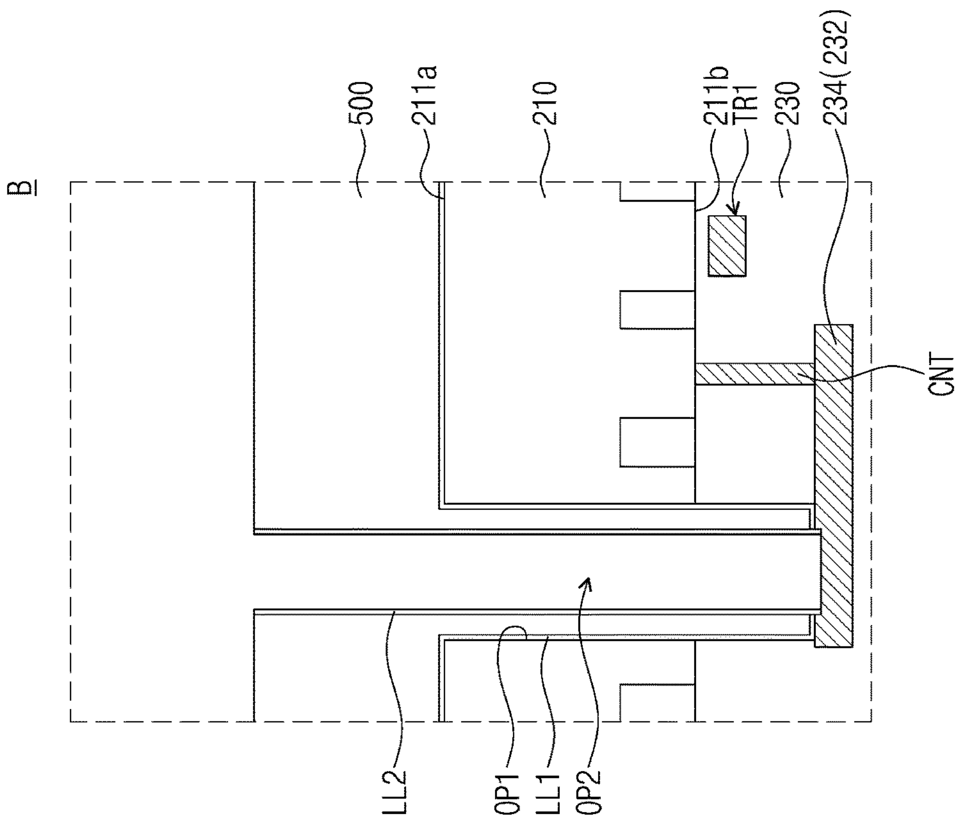
Figure 16B:
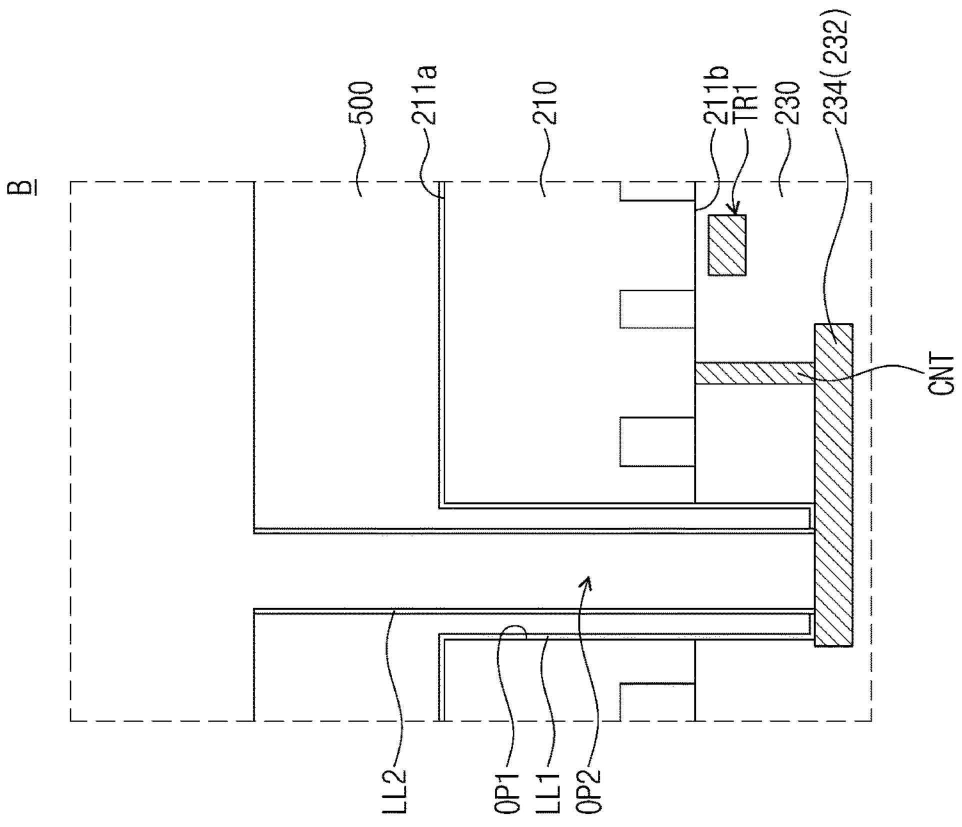

Referring to FIGS. 1, 16A, and 16B, a second liner layer LL2 may be formed on the second opening OP2 in the resultant structure of FIGS. 14A and 14B. For example, a dielectric layer may be conformally deposited to the top surface of the sacrificial layer 500 and on bottom and inner lateral or side surfaces of the second opening OP2, and then the dielectric layer may undergo an anisotropic etching process to form the second liner layer LL2. Therefore, the second liner layer LL2 may remain only on the inner lateral surface of the second opening OP2, and the third wiring pattern 234 may be exposed. The second liner layer LL2 may include silicon nitride (SiN) or silicon oxynitride (SiON).

In some embodiments, as shown in FIG. 14C, the second opening OP2 may penetrate the sacrificial layer 500 and the first liner layer LL1 to extend into the third wiring pattern 234. In this case, as shown in FIG. 16C, the second liner layer LL2 may also extend into the third wiring pattern 234. According to FIG. 16C, a semiconductor package may be fabricated which is discussed with reference to FIG. 7. The following will further describe the embodiment of FIG. 16B.

Figure 17A:
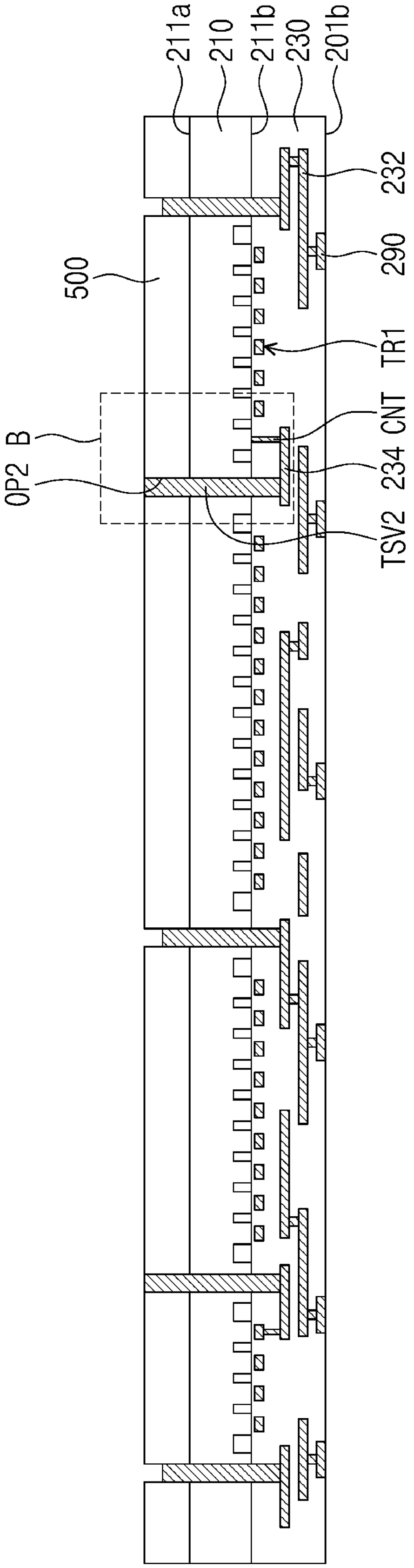
Figure 17B:
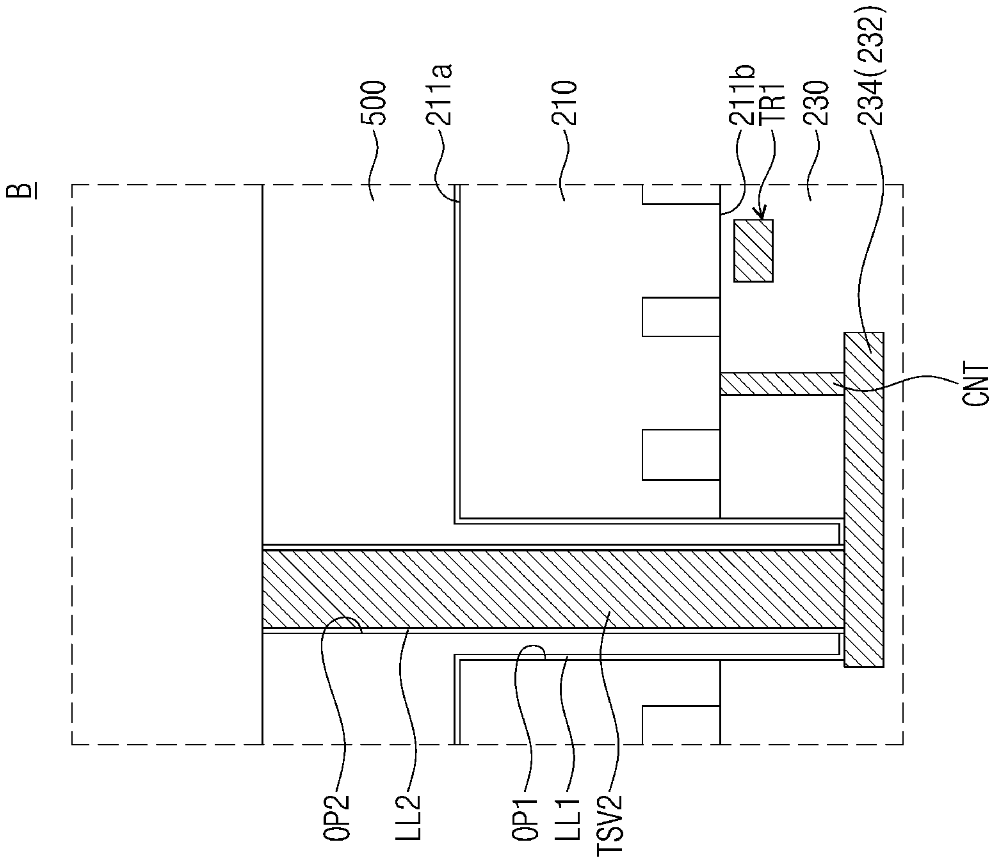

Referring to FIGS. 1, 17A, and 17B, a second through via TSV2 may be formed in the second opening OP2. For example, the second opening OP2 may be filled with a conductive material to form the second through via TSV2. For more detail, a conductive layer may be formed on the second liner layer LL2. The conductive layer may cover a top surface of the second liner layer LL2 and may fill the second liner layer LL2 in the second opening OP2. After that, a planarization process may be performed on the sacrificial layer 500 until the top surface of the sacrificial layer 500 is exposed. After the planarization process, the conductive layer remaining in the second opening OP2 may be formed into the second through via TSV2. The second through via TSV2 may be coupled to the third wiring pattern 234. According to FIGS. 16A, 16B, 17A, and 17B, a semiconductor package may be fabricated as is discussed with reference to FIG. 6. The following will further describe the embodiment of FIGS. 15A and 15B.

Figure 18A:
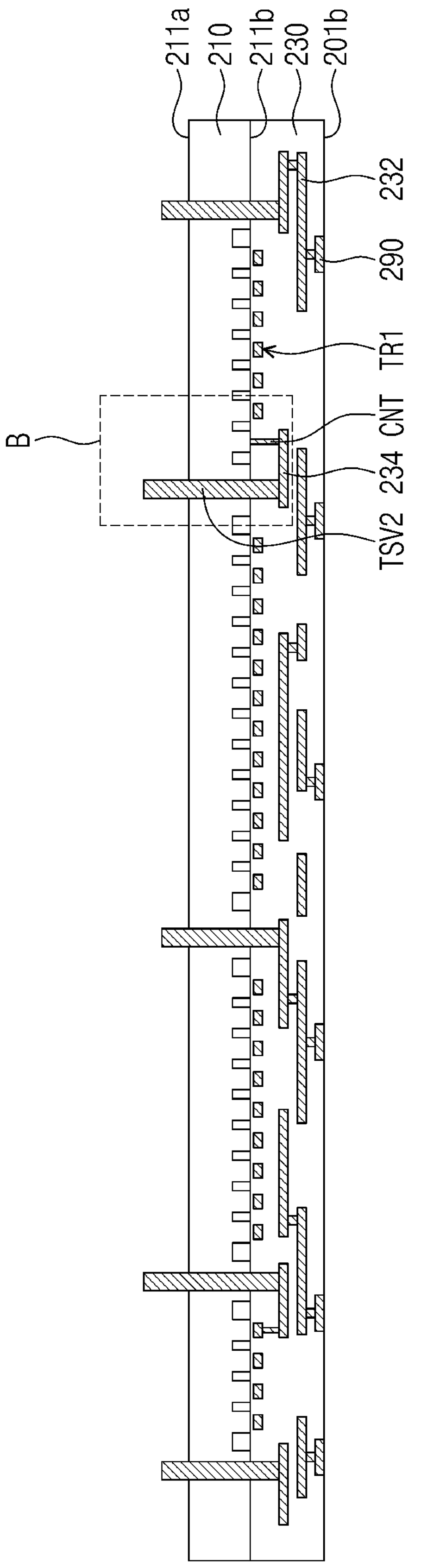
Figure 18B:
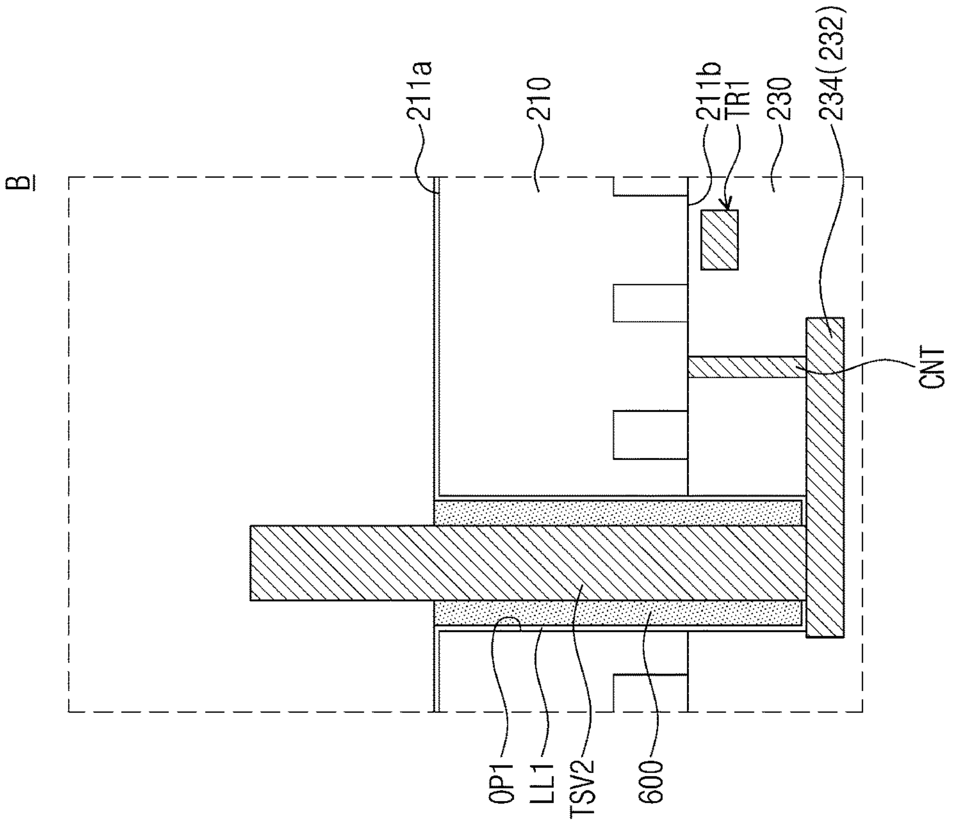

Referring to FIGS. 1, 18A, and 18B, the sacrificial layer 500 may be removed. Therefore, the first liner layer LL1 may be exposed, and the first opening OP1 may have an empty space other than a space occupied by the first liner layer LL1 and the second through via TSV2.

Figure 18C:
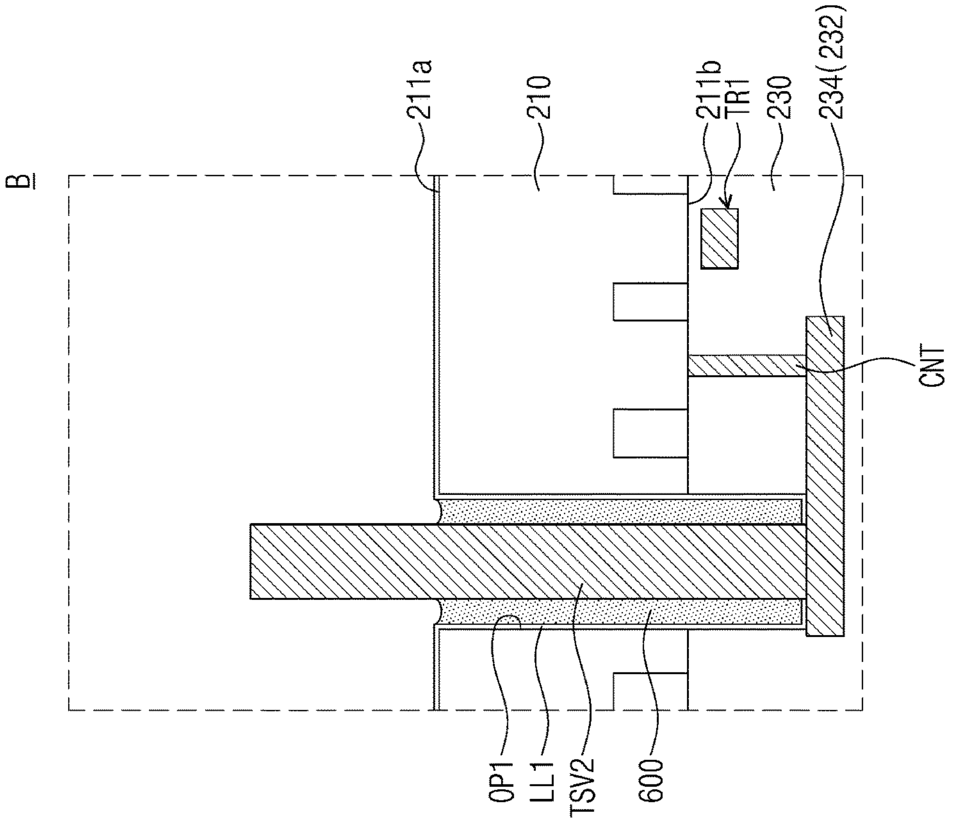

Afterwards, a decomposition layer 600 may be formed in the first opening OP1. For example, a decomposition material layer may be formed on the first liner layer LL1. The decomposition material layer may cover a top surface of the first liner layer LL1, and may fill the first opening OP1 (e.g., the empty space other than the space occupied by the first liner layer LL1 and the second through via TSV2). After that, an etch-back process may be performed on the decomposition material layer. The etch-back process may continue until the decomposition material layer remains only in the first opening OP1. The decomposition material layer may include a material which can be decomposed with heat or ultraviolet light. FIG. 18B depicts that the decomposition layer 600 is formed to have a top surface at the same vertical level as that of the top surface of the first liner layer LL1, but the present inventive concepts are not limited thereto. As shown in FIG. 18C, depending on an etchant used in the etch-back process, the decomposition layer 600 may have a top surface at a lower vertical level than that of the top surface of the first liner layer LL1, and in this case, the top surface of the decomposition layer 600 may have a downwardly concave shape.

Figure 19A:
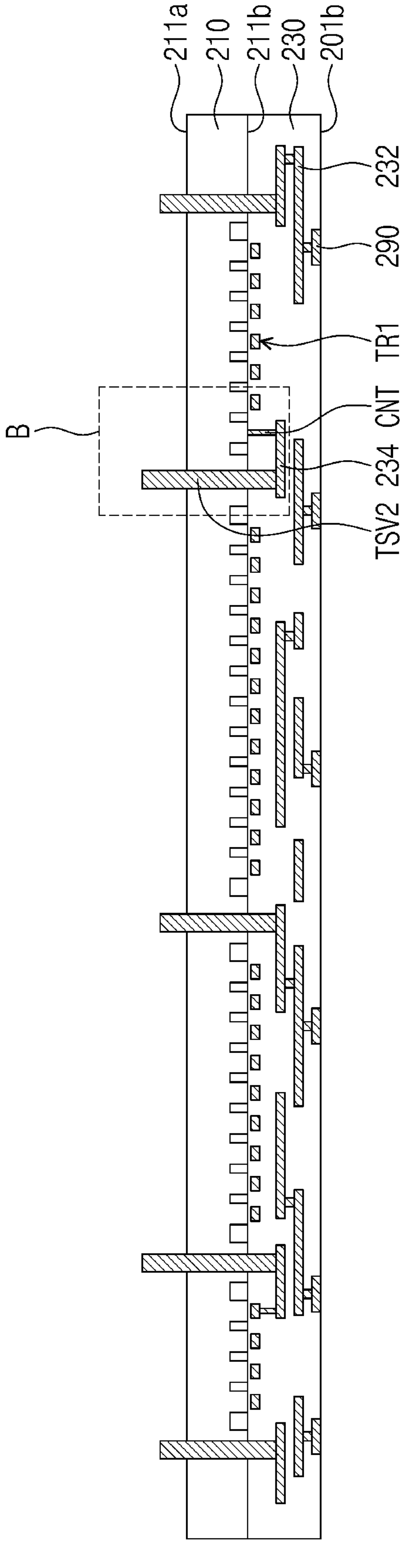
Figure 19B:
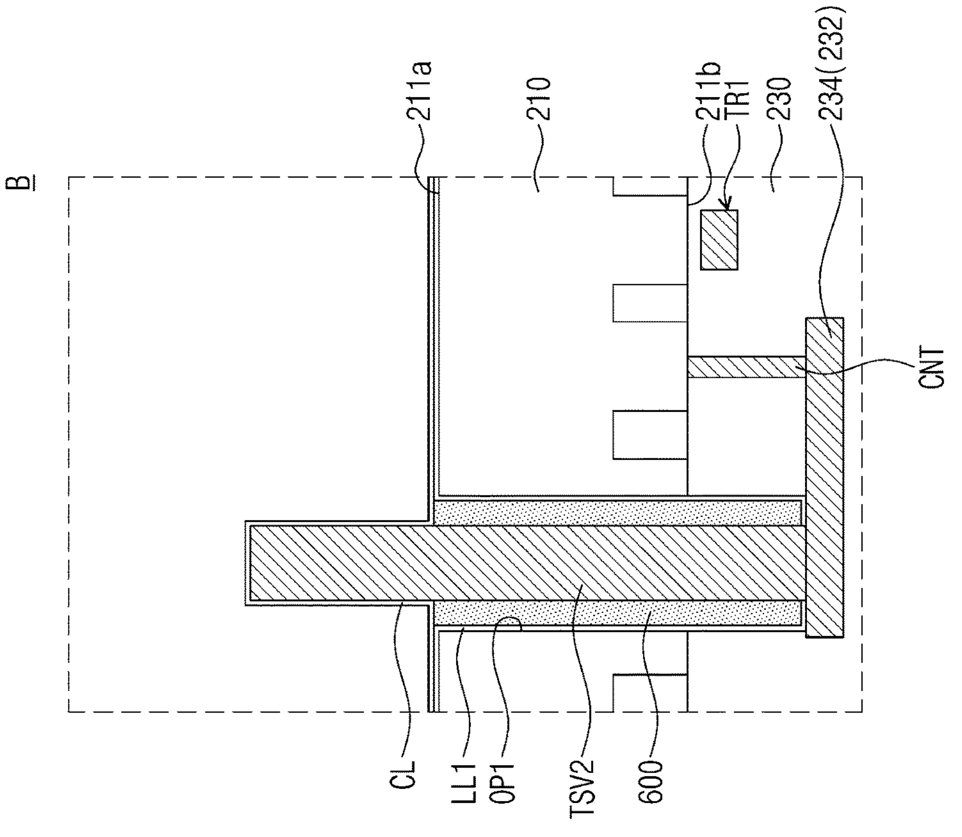

Referring to FIGS. 1, 19A, and 19B, a capping layer CL may be formed on the first surface 211*a* of the second semiconductor substrate 210. For example, the capping layer CL may be formed by depositing a dielectric layer on the second through via TSV2 and the top surface of the first liner layer LL1. The capping layer CL may conformally cover the top surface of the first liner layer LL1 and lateral and top surfaces of the second through via TSV2. In this step, the capping layer CL may cover the top surface of the decomposition layer 600, and the decomposition layer 600 may be surrounded by the capping layer CL, the first liner layer LL1, and the second through via TSV2. The capping layer CL may include silicon oxide (SiO).

Figure 19C:
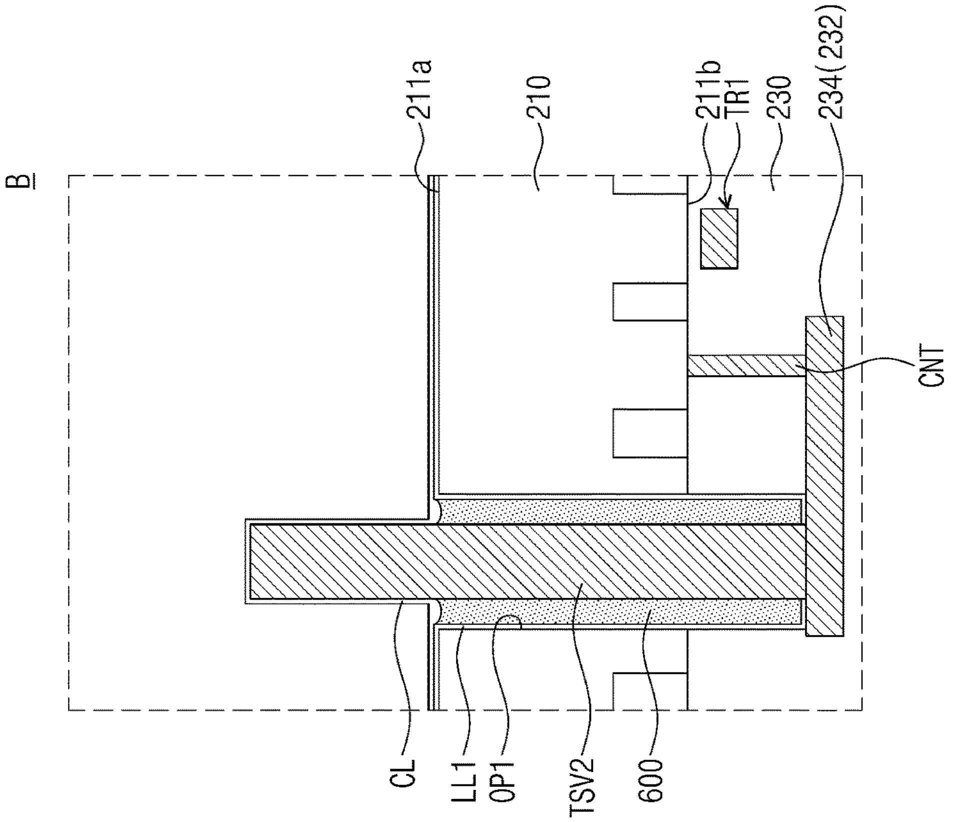

In some embodiments, as shown in FIG. 18C, the decomposition layer 600 may be formed to have a concave shape on its top surface. In this case, as shown in FIG. 19C, the capping layer CL may fill a concave portion of the top surface thereof. For example, a portion of the capping layer CL may have a shape that protrudes either toward the decomposition layer 600 or into the first opening OP1. According to FIGS. 18C and 19C, a semiconductor package may be fabricated as is discussed with reference to FIG. 4. The following will further describe the embodiment of FIGS. 19A and 19B.

Figure 20A:
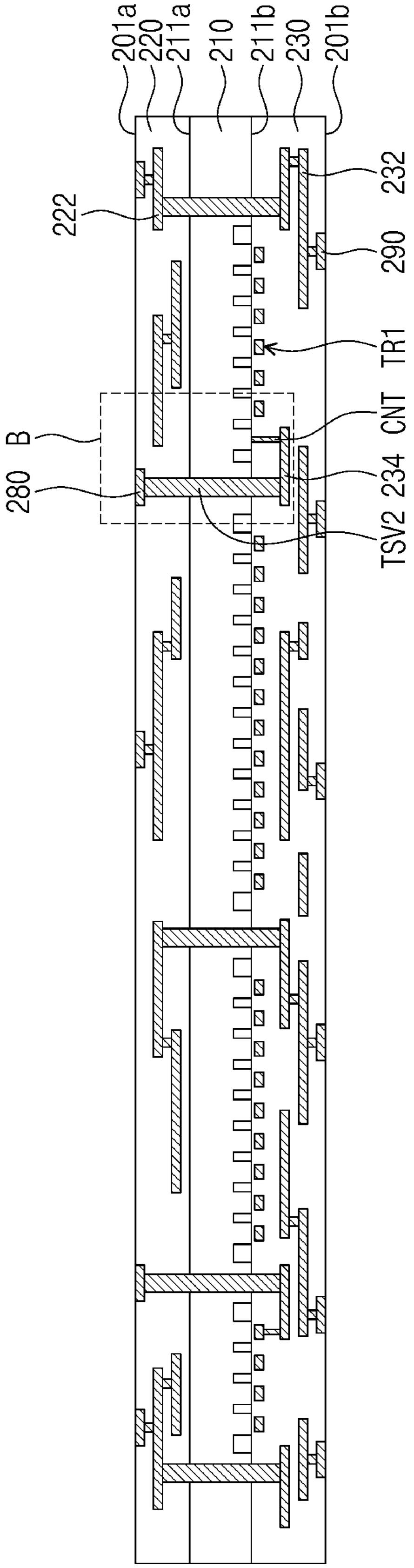
Figure 20B:
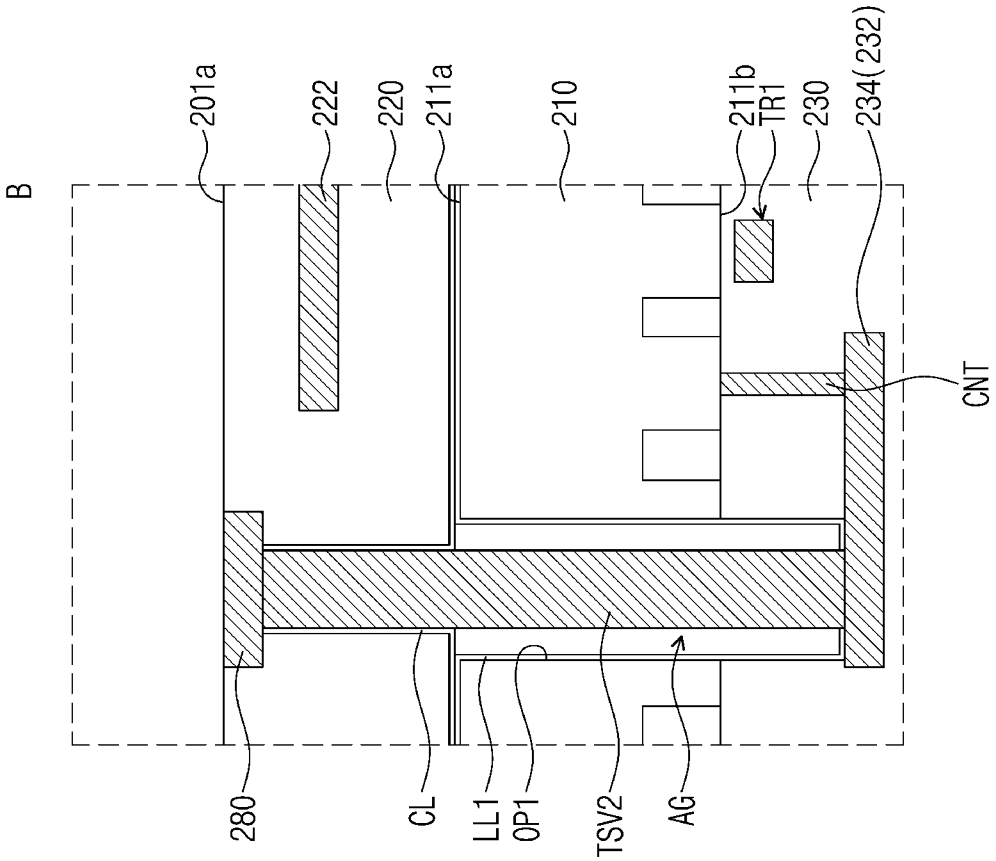

Referring to FIGS. 1, 20A, and 20B, the decomposition layer 600 may be removed. For example, heat or ultraviolet light may be provided onto the second semiconductor substrate 210. The heat or ultraviolet light may eliminate the decomposition layer 600, and an empty inner space may be formed surrounded by the first liner layer LL1, the second through via TSV2, and the capping layer CL. The inner space may be an air gap AG filled with vacuum or air.

According to some embodiments of the present inventive concepts, the decomposition layer 600 may be used to form the air gap AG between the second semiconductor substrate 210 and the second through via TSV2. Therefore, the air gap AG may be formed only on a required region. In addition, the first liner layer LL1 may be formed thin enough to allow the air gap AG to have a sufficient thickness, and increased insulation may be provided between the second semiconductor substrate 210 and the second through via TSV2. As a result, it may be possible to fabricate a semiconductor package 10 with improved electrical properties.

Thereafter, a second dielectric layer 220 and second wiring patterns 222 may be formed. For example, one dielectric layer may be formed by coating a dielectric material on the first surface 211*a* of the second semiconductor substrate 210. A conductive layer may be formed on the dielectric layer, and then the conductive layer may be patterned to form one wiring layer. The formation of the dielectric layer and the conductive layer may be repeated to form the second dielectric layer 220 and the second wiring patterns 222. A second upper conductive pad 280 may be formed in an uppermost dielectric layer, and the second upper conductive pad 280 may be connected to the second through via TSV2 or the second wiring patterns 222 and may be surrounded by the second dielectric layer 220. The second dielectric layer 220 may include silicon oxide (SiO).

Through the processes mentioned above, a second semiconductor chip 200 may be formed.

Referring to FIGS. 1 and 2, a first semiconductor chip 100 may be provided. The first semiconductor chip 100 may be the same as that discussed with reference to FIG. 1. For example, the first semiconductor chip 100 may include a first upper conductive pad 180 disposed on a first top surface 101*a* thereof. The first semiconductor chip 100 may include a first lower conductive pad 190 disposed adjacent to a first bottom surface 101*b* thereof. The first semiconductor chip 100 may be, for example, an image sensor chip.

The first semiconductor chip 100 may be mounted on the second semiconductor chip 200. For example, the first semiconductor chip 100 and the second semiconductor chip 200 may be aligned to allow the first lower conductive pad 190 of the first semiconductor chip 100 to face the second upper conductive pad 280 of the second semiconductor chip 200. After the first and second semiconductor chips 100 and 200 are in contact with each other, an annealing process may be performed on the first and second semiconductor chips 100 and 200. The annealing process may cause bonding between the first lower conductive pad 190 and the second upper conductive pad 280. For example, the first lower conductive pad 190 and the second upper conductive pad 280 may be combined into a single unitary body. Automatic bonding may be carried out between the first lower conductive pad 190 and the second upper conductive pad 280. For example, the first lower conductive pad 190 and the second upper conductive pad 280 may be formed of the same material (e.g., copper (Cu)), and may be bonded due to an intermetallic hybrid bonding process resulting from surface activation on an interface between the first lower conductive pad 190 and the second upper conductive pad 280 that are in contact with each other. The annealing process may induce bonding between the first dielectric layer 120 and the second dielectric layer 220.

A third semiconductor chip 300 may be provided. The third semiconductor chip 300 may be the same as that discussed with reference to FIG. 1. For example, the third semiconductor chip 300 may include a third upper conductive pad 380 disposed adjacent to a third top surface 301*a* thereof. The third semiconductor chip 300 may be, for example, a memory chip that stores data produced from the second semiconductor chip 200.

The third semiconductor chip 300 may be mounted below the second semiconductor chip 200. For example, the second semiconductor chip 200 and the third semiconductor chip 300 may be aligned to allow the second lower conductive pad 290 of the second semiconductor chip 200 to face the third upper conductive pad 380 of the third semiconductor chip 300. After the second and third semiconductor chips 200 and 300 are in contact with each other, an annealing process may be performed on the second and third semiconductor chips 200 and 300. The annealing process may cause bonding between the second lower conductive pad 290 and the third upper conductive pad 380. For example, the second lower conductive pad 290 and the third upper conductive pad 380 may be combined into a single unitary body. Automatic bonding may be carried out between the second lower conductive pad 290 and the third upper conductive pad 380. For example, the second lower conductive pad 290 and the third upper conductive pad 380 may be formed of the same material (e.g., copper (Cu)), and may be bonded due to an intermetallic hybrid bonding process resulting from surface activation on an interface between the second lower conductive pad 290 and the third upper conductive pad 380 that are in contact with each other. The annealing process may induce bonding between the third dielectric layer 230 and the fourth dielectric layer 320.

FIGS. 21A to 25A illustrate cross-sectional views showing a method of fabricating a semiconductor package according to some embodiments of the present inventive concepts. FIGS. 21B to 25B illustrate enlarged views showing section B of FIGS. 21A to 25A, respectively. FIGS. 21A to 25A and 21B to 25B explain a method of fabricating a semiconductor package, for example, a method of forming a second semiconductor chip. FIGS. 21A to 25A omit a configuration of a spacer structure, and the spacer structure will be discussed in detail in FIGS. 21B to 25B.

Figure 21A:
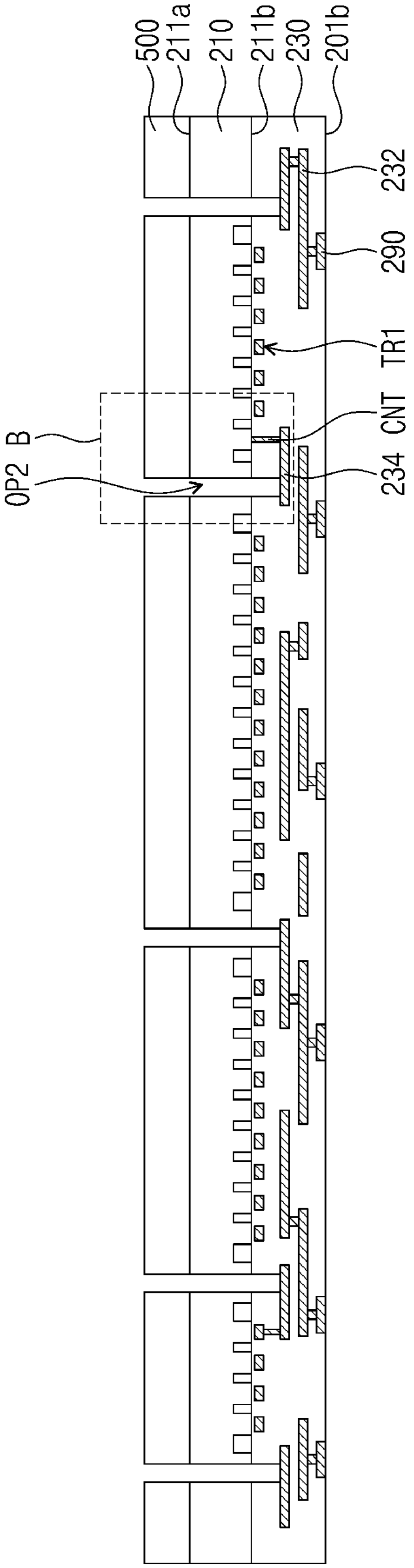
Figure 21B:
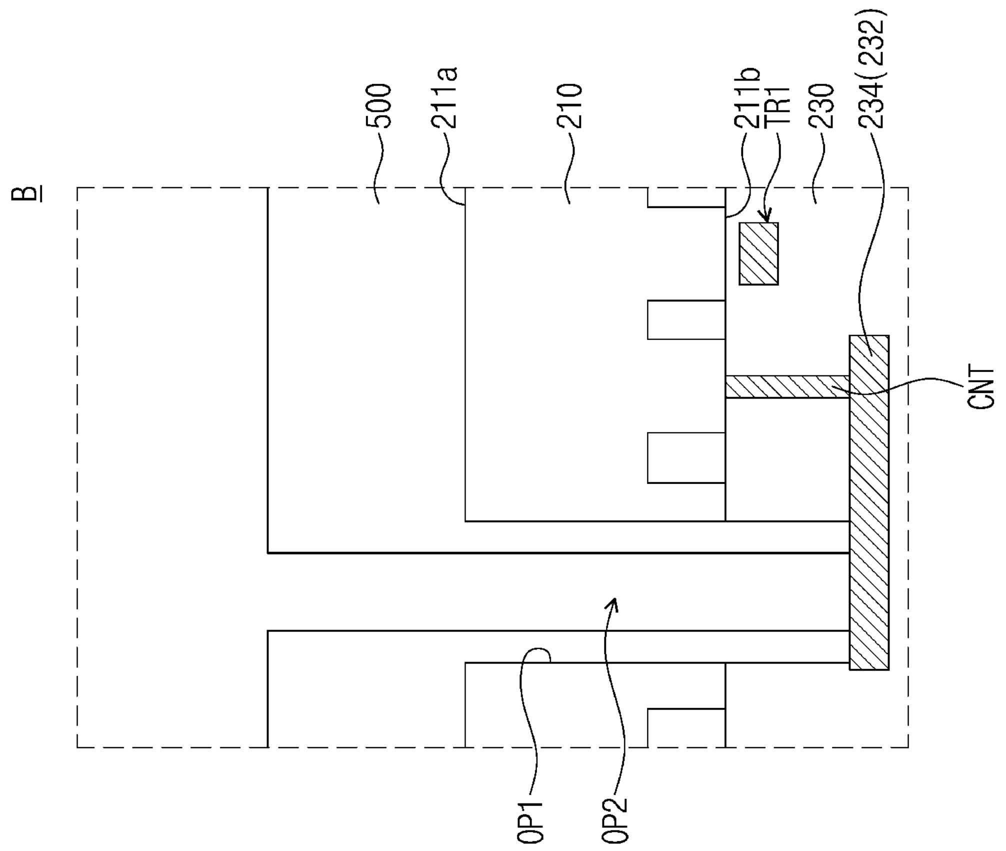

Referring to FIGS. 1, 21A, and 21B, a sacrificial layer 500 may be formed on the second semiconductor substrate 210 in a resultant structure of FIGS. 11A and 11B. For example, the sacrificial layer 500 may be formed by coating or depositing a dielectric material on the first surface 211*a* of the second semiconductor substrate 210. The dielectric material may cover the first surface 211*a* of the second semiconductor substrate 210 and may fill the first opening OP1. The dielectric material may have an etch selectivity with respect to the second semiconductor substrate 210.

The sacrificial layer 500 may be etched to form a second opening OP2. For example, a mask pattern may be formed on the sacrificial layer 500, and then the mask pattern may be used as an etching mask to etch the sacrificial layer 500. The second opening OP2 may be positioned within the first opening OP1. The second opening OP2 may be spaced apart from an inner lateral or side surface of the first opening OP1. For example, the sacrificial layer 500 may remain between the second opening OP2 and the inner lateral surface of the first opening OP1. The second opening OP2 may expose the third wiring pattern 234.

Figure 22A:
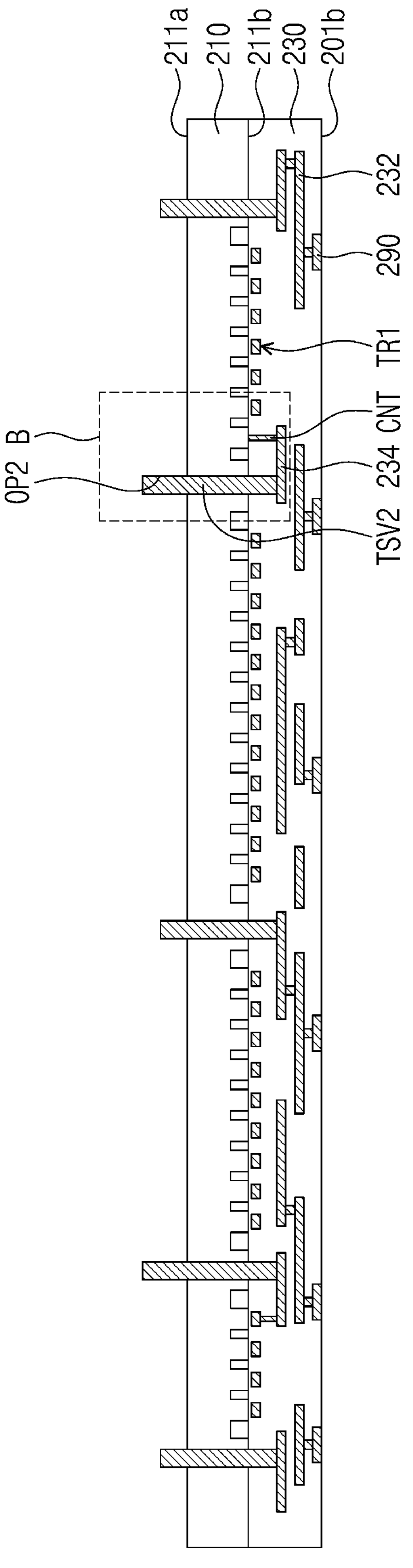
Figure 22B:
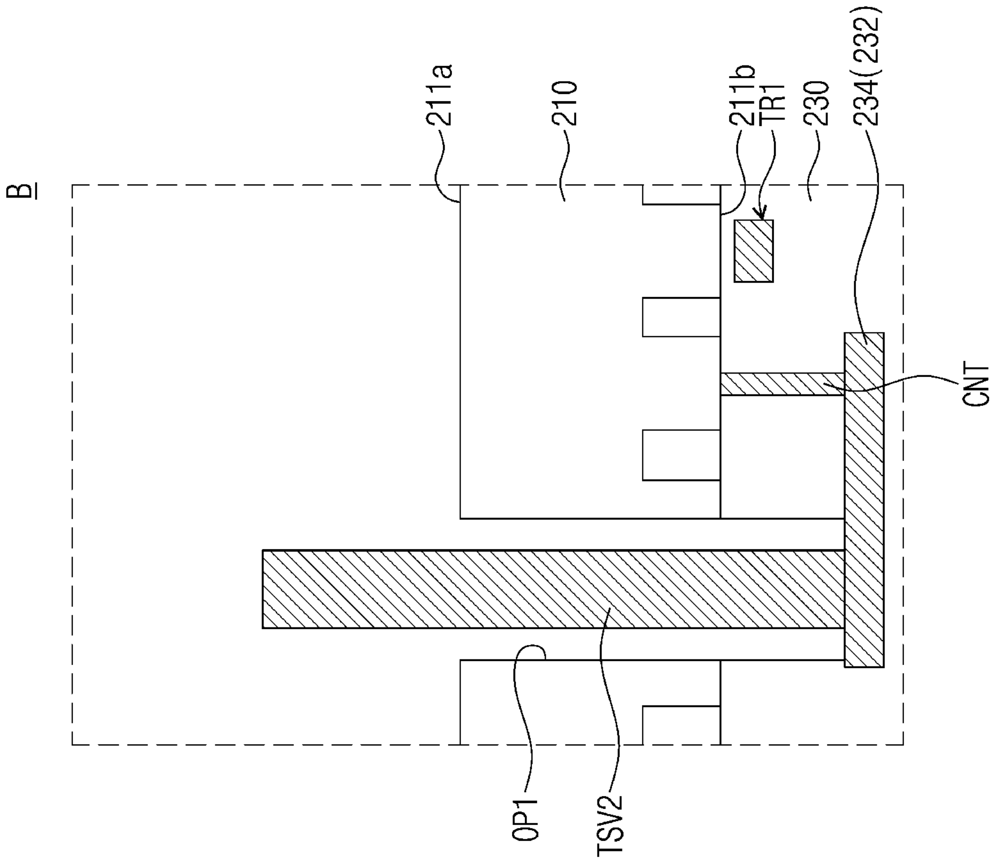

Referring to FIGS. 1, 22A, and 22B, a second through via TSV2 may be formed in the second opening OP2. For example, the second opening OP2 may be filled with a conductive material to form the second through via TSV2. For more detail, a conductive layer may be formed on the sacrificial layer 500. The conductive layer may cover a top surface of the sacrificial layer 500 and may fill the second opening OP2. Thereafter, a planarization process may be performed on the sacrificial layer 500 until the top surface of the sacrificial layer 500 is exposed. After the planarization process, the conductive layer remaining in the second opening OP2 may be formed into the second through via TSV2. The second through via TSV2 may be coupled to the third wiring pattern 234.

The sacrificial layer 500 may be removed. Therefore, the second semiconductor substrate 210 may be exposed, and the first opening OP1 may have an empty space other than a space occupied by the second through via TSV2.

Figure 23A:
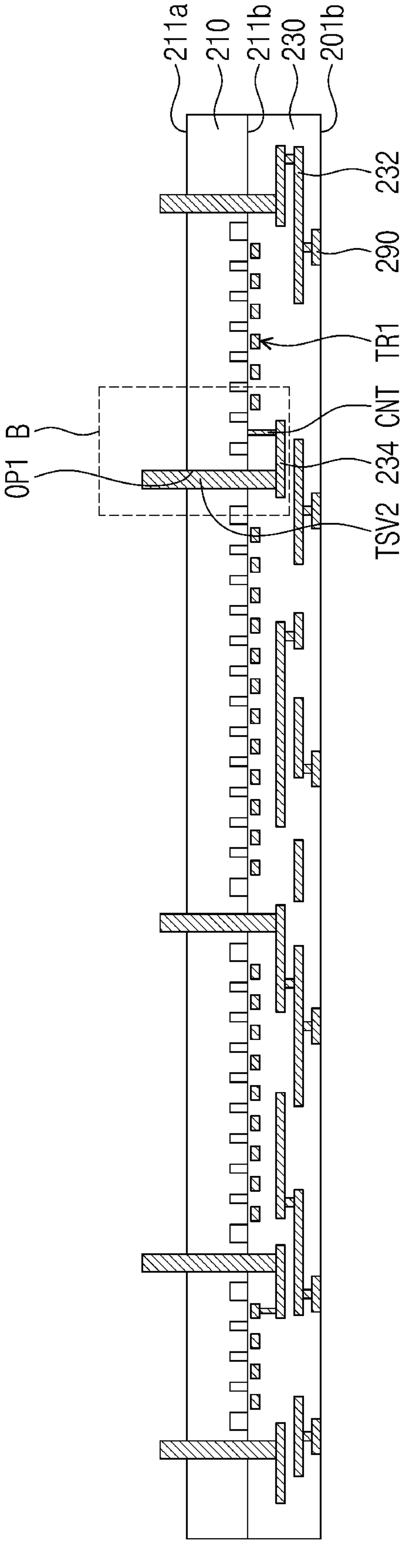
Figure 23B:
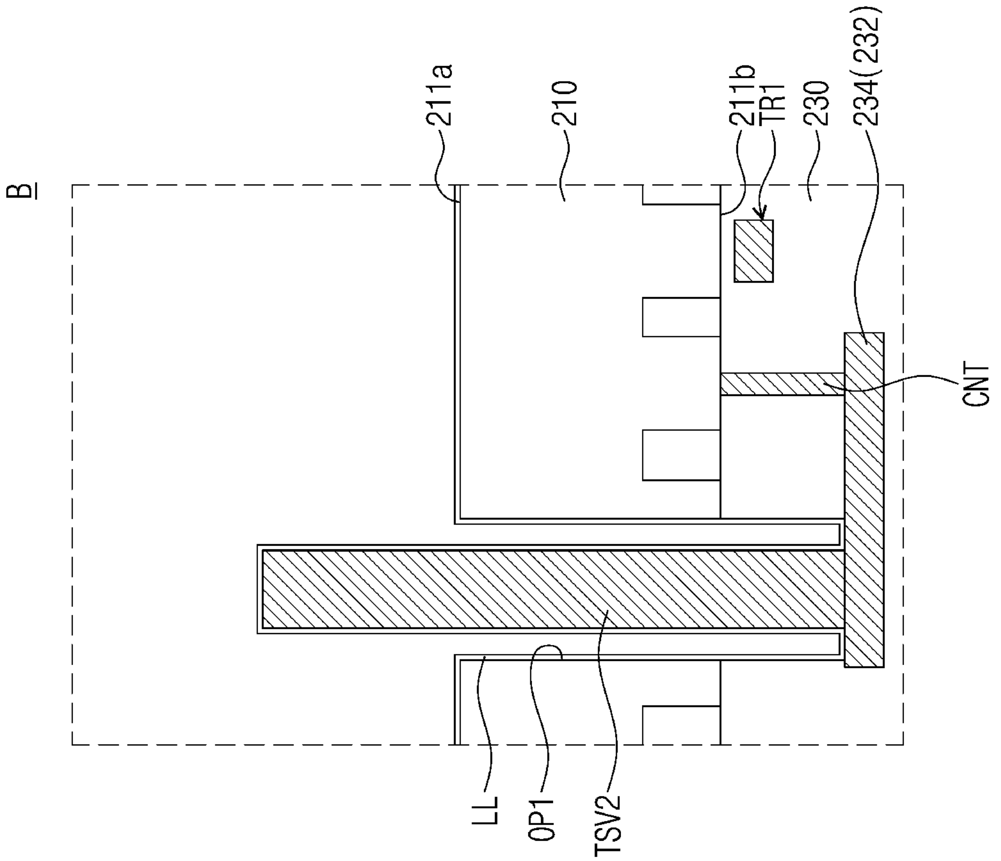

Referring to FIGS. 1, 23A, and 23B, a liner layer LL may be formed on the second semiconductor substrate 210. For example, the liner layer LL may be formed by depositing a dielectric material on the first surface 211*a* of the second semiconductor substrate 210. The liner layer LL may conformally cover the first surface 211*a* of the second semiconductor substrate 210, an inner lateral or side surface of the first opening OP1, a bottom surface of the first opening OP1, and lateral and top surfaces of the second through via TSV2. The liner layer LL may include silicon nitride (SiN) or silicon oxynitride (SiON).

Figure 24A:
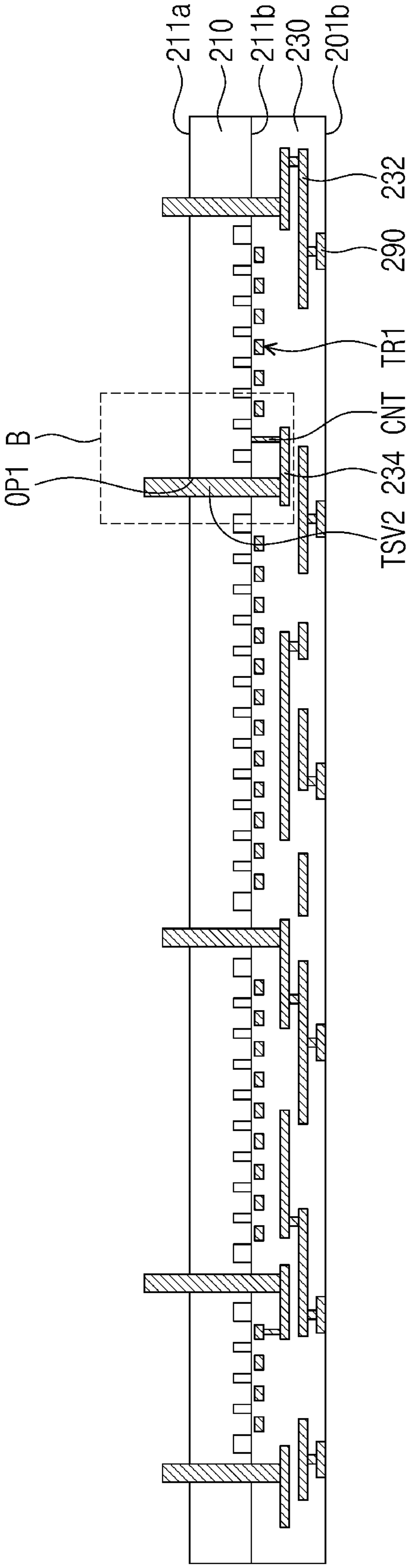
Figure 24B:
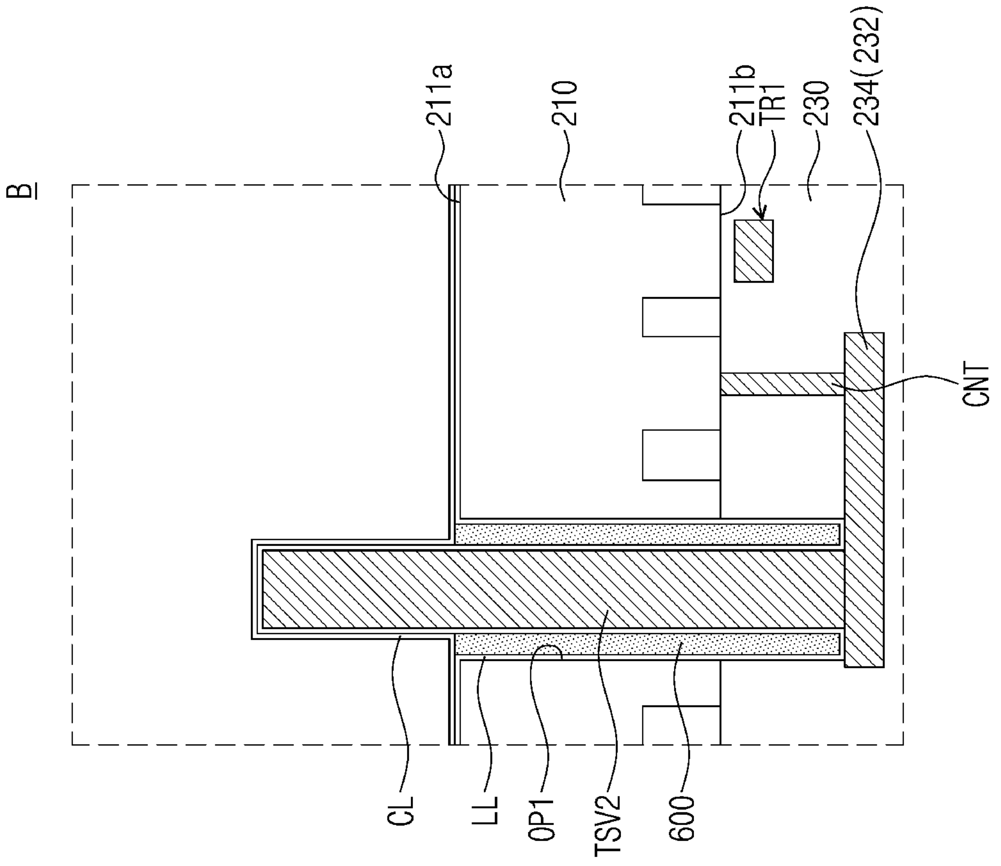

Referring to FIGS. 1, 24A, and 24B, a decomposition layer 600 may be formed in the first opening OP1. For example, a decomposition material layer may be formed on the liner layer LL. The decomposition material layer may cover a top surface of the liner layer LL, and may fill the first opening OP1 (e.g., the empty space other than the space occupied by the second through via TSV2). After that, an etch-back process may be performed on the decomposition material layer. The etch-back process may continue until the decomposition material layer remains only in the first opening OP1. The decomposition material layer may include a material which can be decomposed with heat or ultraviolet light. FIG. 24B depicts that the decomposition layer 600 is formed to have a top surface located at the same vertical level as that of the top surface of the liner layer LL positioned on the first surface 211*a* of the second semiconductor substrate 210, but the present inventive concepts are not limited thereto. Depending on an etchant used in the etch-back process, the top surface of the decomposition layer 600 may have a downwardly concave shape.

A capping layer CL may be formed on the first surface 211*a* of the second semiconductor substrate 210. For example, the capping layer CL may be formed by depositing a dielectric layer on the second through via TSV2 and the top surface of the liner layer LL. The capping layer CL may conformally cover the top surface of the liner layer LL and the top surface of the decomposition layer 600. In this case, the decomposition layer 600 may be surrounded by the capping layer CL and the liner layer LL. The capping layer CL may include silicon oxide (SiO).

Figure 25A:
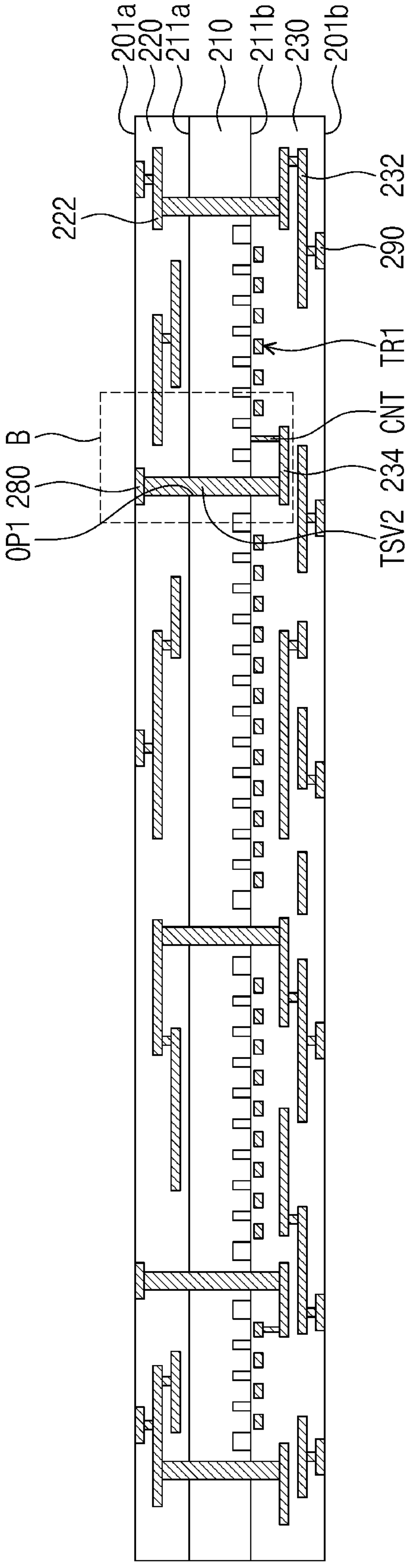
Figure 25B:
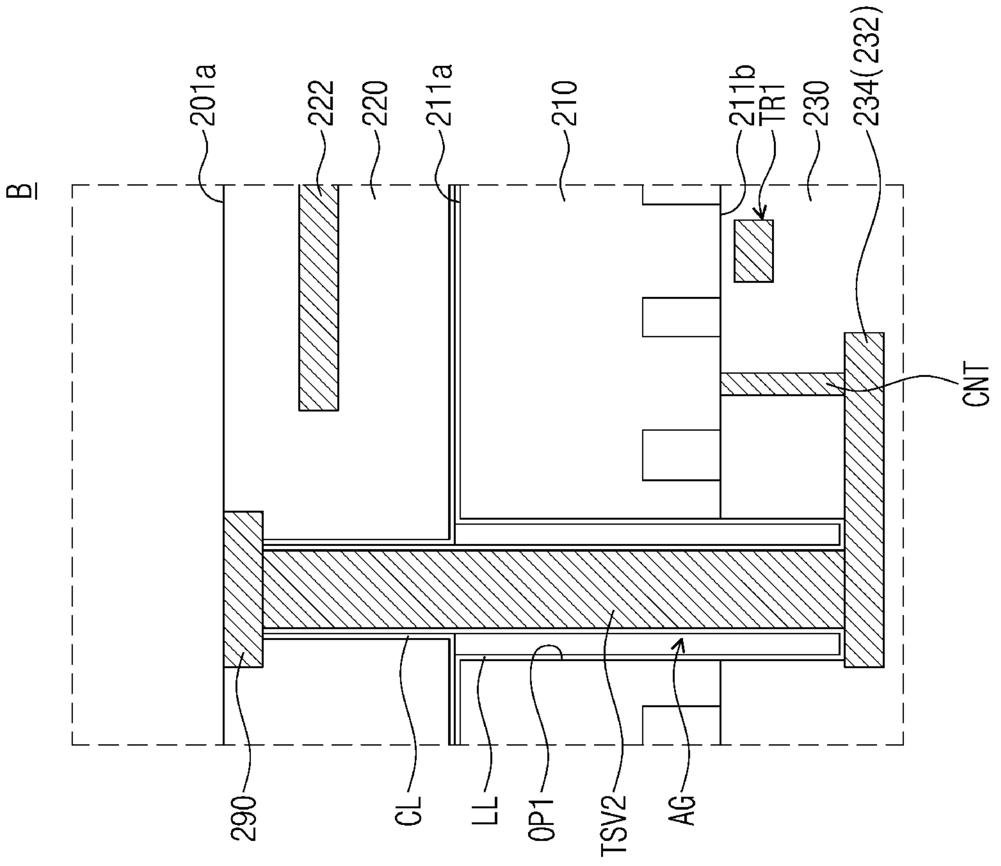

Referring to FIGS. 1, 25A, and 25B, the decomposition layer 600 may be removed. For example, heat or ultraviolet light may be provided onto the second semiconductor substrate 210. The heat or ultraviolet light may eliminate the decomposition layer 600, and an empty space may be formed surrounded by the liner layer LL and the capping layer CL. The inner space may be an air gap AG filled with vacuum or air.

Thereafter, a second dielectric layer 220 and second wiring patterns 222 may be formed. For example, one dielectric layer may be formed by coating a dielectric material on the first surface 211*a* of the second semiconductor substrate 210. A conductive layer may be formed on the dielectric layer, and then the conductive layer may be patterned to form one wiring layer. The formation of the dielectric layer and the conductive layer may be repeated to form the second dielectric layer 220 and the second wiring patterns 222. A second upper conductive pad 280 may be formed in an uppermost dielectric layer, and the second upper conductive pad 280 may be connected to the second through via TSV2 or the second wiring patterns 222 and may be surrounded by the second dielectric layer 220. The second dielectric layer 220 may include silicon oxide (SiO).

Through the processes mentioned above, a second semiconductor chip 200 may be formed.

Referring to FIGS. 1 and 2, a first semiconductor chip 100 may be provided. The first semiconductor chip 100 may include a first upper conductive pad 180 disposed on a first top surface 101*a* thereof. The first semiconductor chip 100 may include a first lower conductive pad 190 disposed adjacent to a first bottom surface 101*b* thereof. The first semiconductor chip 100 may be, for example, an image sensor chip. The first semiconductor chip 100 may be mounted on the second semiconductor chip 200.

A third semiconductor chip 300 may be provided. The third semiconductor chip 300 may include a third upper conductive pad 380 disposed adjacent to a third top surface 301*a* thereof. The third semiconductor chip 300 may be, for example, a memory chip that stores data produced from the second semiconductor chip 200. The third semiconductor chip 300 may be mounted below the second semiconductor chip 200.

A semiconductor package according to some embodiments of the present inventive concepts may be configured such that a through via may penetrate a semiconductor substrate formed of silicon (Si), and that the through via and the semiconductor substrate may be electrically insulated through an air gap whose dielectric constant is 1 or almost 1, which may result in achievement of remarkably excellent electrical properties, compared to a case where the through via and the semiconductor substrate are electrically insulated through a silicon oxide layer. For example, there may be a reduction in tunneling effect or parasitic capacitance between the through via and the semiconductor substrate. As a result, there may be provided a semiconductor package whose electrical properties are improved.

Further, when the through via and the semiconductor substrate are formed of different materials from each other, a coefficient of thermal expansion (CTE) mismatch may cause distortion of the through via. In this case, as a liner layer and an air gap are present between the through via and the semiconductor substrate, there may be essentially no risk of direct contact of the through via with the semiconductor substrate. As discussed above, as the air gap can serve as a stress buffer, a stress may be vanished or reduced to a level which is insufficient to influence one or both the through via and the semiconductor substrate. As a result, the semiconductor package may be provided to have increased structural stability.

Although the present inventive concepts have been described in connection with some embodiments of the present inventive concepts illustrated in the accompanying drawings, it will be understood by one of ordinary skill in the art that variations in form and detail may be made therein without departing from the scope of the present inventive concepts. The above disclosed embodiments should thus be considered illustrative and not restrictive.

What is claimed is:

1. A semiconductor package, comprising:
a first semiconductor chip;
a second semiconductor chip below the first semiconductor chip; and
a third semiconductor chip below the second semiconductor chip,
wherein the second semiconductor chip includes:
a semiconductor substrate;
a first wiring layer on a first surface of the semiconductor substrate;
a second wiring layer on a second surface of the semiconductor substrate; and
a through via that penetrates the semiconductor substrate and electrically connects the first wiring layer and the second wiring layer,
wherein the semiconductor substrate and the through via are spaced apart from each other across a spacer structure,
wherein the spacer structure includes:
a first liner layer in contact with the semiconductor substrate;
a second liner layer in contact with the through via;
an air gap between the first liner layer and the second liner layer; and
a capping layer that seals the air gap on the first liner layer and the second liner layer and extends between the second wiring layer and a lateral or side surface of the through via,
wherein the capping layer includes a dielectric material, wherein:
the first wiring layer includes a conductive pattern,
the second wiring layer includes a first pad, and
the through via vertically connects the conductive pattern and the first pad, and
wherein:
the semiconductor substrate includes an opening through which the through via extends,
the first liner layer extends along an inner lateral surface of the opening of the semiconductor substrate to a top surface of the conductive pattern, and
the first liner layer extends along the inner lateral surface of the opening and onto the second surface of the semiconductor substrate.

2. The semiconductor package of claim 1, wherein
the first semiconductor chip includes a second pad on a third surface of the first semiconductor chip, the third surface facing the second semiconductor chip, and
the first pad and the second pad are in direct contact with each other on an interface between the first semiconductor chip and the second semiconductor chip.

3. The semiconductor package of claim 1, wherein a portion of the through via is in the conductive pattern.

4. The semiconductor package of claim 1, wherein the spacer structure extends into the second wiring layer with the spacer structure between the through via and the second wiring layer.

5. The semiconductor package of claim 1, wherein the capping layer extends along the second surface of the semiconductor substrate and onto a lateral surface of the through via that protrudes from the second surface of the semiconductor substrate.

6. The semiconductor package of claim 1, wherein the second liner layer covers at least a portion of a lateral surface of the through via.

7. The semiconductor package of claim 6, wherein
the first liner layer has a hollow cylindrical shape, and
the through via and the second liner layer vertically penetrate an inner space defined by the first liner layer.

8. The semiconductor package of claim 1, wherein
the first semiconductor chip is an image sensor chip,
the second semiconductor chip is a logic chip configured to drive the image sensor chip, and
the third semiconductor chip is a memory chip configured to store data produced from the logic chip.

9. The semiconductor package of claim 1, wherein the second semiconductor chip further includes a transistor on one of the first and second surfaces of the semiconductor substrate, and
wherein the transistor is electrically connected to the first semiconductor chip through the first wiring layer and the through via.

10. The semiconductor package of claim 1, wherein a width of the air gap between the first liner layer and the second liner layer is in a range of about 10 nm to about 1 μm.

11. A semiconductor package, comprising:
an image sensor chip including a first pad;
a logic chip below the image sensor chip and including a second pad, wherein the first pad and the second pad are in direct contact with each other on an interface between the image sensor chip and the logic chip; and
a memory chip below the logic chip,
wherein the logic chip includes:
a semiconductor substrate;
a conductive pattern on an active surface of the semiconductor substrate;
a first dielectric layer that covers the conductive pattern on the active surface of the semiconductor substrate;
a through hole that vertically penetrates the semiconductor substrate and at least a portion of the first dielectric layer and exposes the conductive pattern;
a first liner layer that conformally covers an inner side surface and at least a portion of a bottom surface of the through hole;
a capping layer that covers at least a portion of the through hole and an inactive surface of the semiconductor substrate;
a second dielectric layer that covers the capping layer on the inactive surface of the semiconductor substrate; and
a through via in the through hole, the through hole penetrating at least a portion of the second dielectric layer and the first liner layer and connecting the first pad to the conductive pattern, and
wherein, in the through hole, an air gap is defined by the through via, the first liner layer, and the capping layer.

12. The semiconductor package of claim 11, further comprising a second liner layer that covers at least a portion of a side surface of the through via,
wherein the air gap is surrounded by the first liner layer, the second liner layer, and the capping layer.

13. The semiconductor package of claim 11, wherein a portion of the through via is received in the conductive pattern.

14. The semiconductor package of claim 11, wherein the first liner layer extends between the capping layer and the inactive surface of the semiconductor substrate.

15. The semiconductor package of claim 11, wherein
a portion of the capping layer extends into the air gap, and a bottom end of the capping layer is at a vertical level lower than a vertical level of a top surface of the first liner layer on the inactive surface of the semiconductor substrate.

16. The semiconductor package of claim 11, wherein the capping layer extends from the inactive surface of the semiconductor substrate through an upper side of the air gap onto a side surface of the through via that protrudes from the inactive surface of the semiconductor substrate.

17. A semiconductor package, comprising:

a first semiconductor chip including a first pad;

a second semiconductor chip below the first semiconductor chip and including a second pad; and a third semiconductor chip below the second semiconductor chip, wherein the second semiconductor chip includes:

a semiconductor substrate;

a conductive pattern on a first surface of the semiconductor substrate;

a first dielectric layer that covers the conductive pattern on the first surface of the semiconductor substrate;

a through hole that vertically penetrates the semiconductor substrate and at least a portion of the first dielectric layer;

a first liner layer that conformally covers an inner side surface and at least a portion of a bottom surface of the through hole;

a capping layer that covers at least a portion of the through hole and a second surface of the semiconductor substrate;

a second dielectric layer that covers the capping layer on the second surface of the semiconductor substrate; and a through via in the through hole, the through hole penetrating at least a portion of the second dielectric layer and the first liner layer and connecting the first pad to the conductive pattern, and wherein, in the through hole, an air gap is defined by the through via, the first liner layer, and the capping layer.

18. The semiconductor package of claim 17, further comprising a second liner layer that covers at least a portion of a side surface of the through via, wherein the air gap is surrounded by the first liner layer, the second liner layer, and the capping layer.

* * * * *